(12) United States Patent
Ohashi

(10) Patent No.: US 10,756,657 B2
(45) Date of Patent: Aug. 25, 2020

(54) MOTOR CONTROL APPARATUS AND MOTOR CONTROL METHOD FOR REDUCING INFLUENCE OF MAGNETIC FLUXES FROM YOKES

(71) Applicant: CANON KABUSHIKI KAISHA, Tokyo (JP)

(72) Inventor: Kaishi Ohashi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/240,893

(22) Filed: Jan. 7, 2019

(65) Prior Publication Data

US 2019/0222151 A1    Jul. 18, 2019

(30) Foreign Application Priority Data

Jan. 12, 2018 (JP) .................................. 2018-003467
Sep. 19, 2018 (JP) .................................. 2018-175204

(51) Int. Cl.
| | |
|---|---|
| *H02P 8/12* | (2006.01) |
| *H02K 29/08* | (2006.01) |
| *H02P 8/38* | (2006.01) |
| *H02K 37/14* | (2006.01) |
| *H02K 11/215* | (2016.01) |
| *H03K 5/24* | (2006.01) |

(52) U.S. Cl.
CPC .............. *H02P 8/12* (2013.01); *H02K 11/215* (2016.01); *H02K 29/08* (2013.01); *H02K 37/14* (2013.01); *H02P 8/38* (2013.01); *H03K 5/24* (2013.01)

(58) Field of Classification Search
CPC .................................. H02P 8/12; H02K 29/08
USPC .................................................... 318/696, 34
See application file for complete search history.

(56) References Cited

U.S. PATENT DOCUMENTS

| | | | | |
|---|---|---|---|---|
| 6,943,523 B2 * | 9/2005 | Feres | ........................ | H02P 8/14 318/41 |
| 8,035,325 B2 * | 10/2011 | Takeuchi | ................ | H02K 29/03 318/400.01 |
| 9,553,535 B2 * | 1/2017 | Aoshima | ................ | H02K 37/14 |

FOREIGN PATENT DOCUMENTS

JP          2014128143 A          7/2014

* cited by examiner

*Primary Examiner* — David Luo
(74) *Attorney, Agent, or Firm* — Rossi, Kimms & McDowell LLP

(57) ABSTRACT

A motor control apparatus for reducing the influence of magnetic fluxes from yokes on the switching of an energization direction. A rotor is rotatable and has a magnet. The magnet is circumferentially divided into a plurality of portions alternately multipolar magnetized to different poles. The coils are energized to excite the magnetic pole portions. Magnetic sensors output signals when detecting magnetic fluxes. Comparators output comparison result signals indicative of results of comparison between the output signals from the magnetic sensors and reference signals. A control circuit controls energization directions of the coils based on the comparison result signals. The control circuit changes the values of the reference signals according to a relationship between the polarities of the magnetic pole portions.

20 Claims, 16 Drawing Sheets

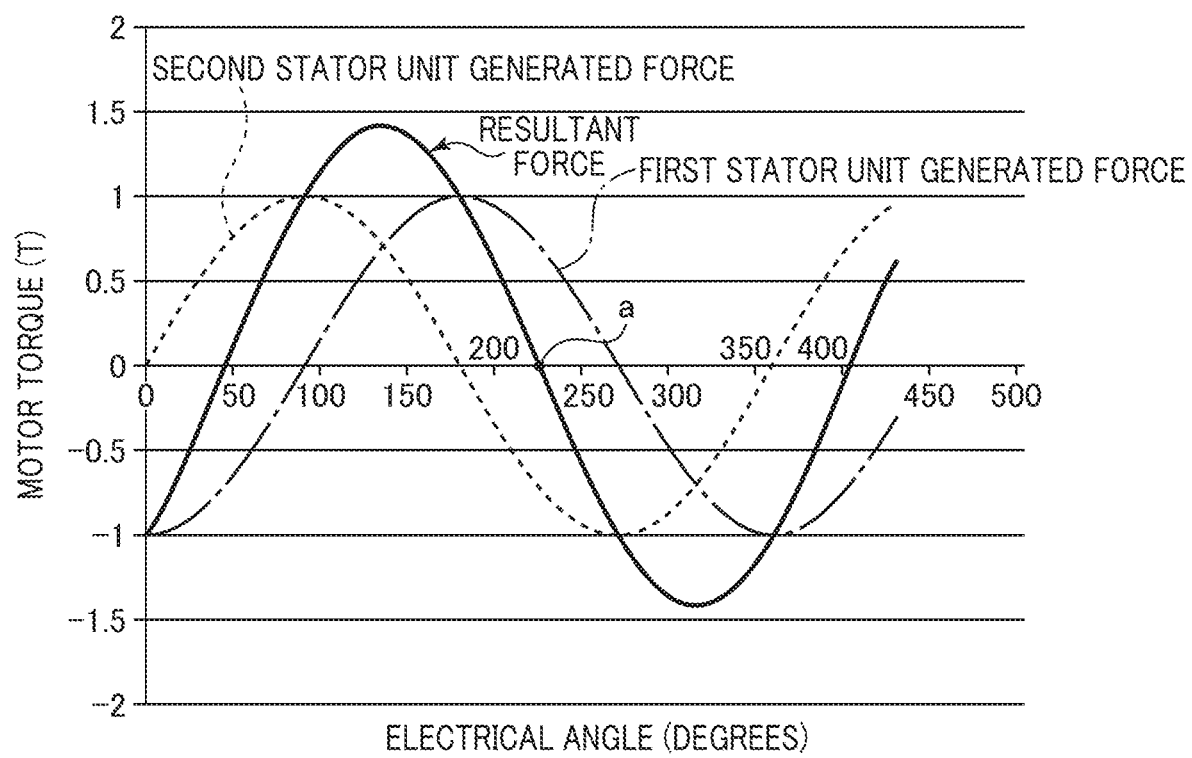

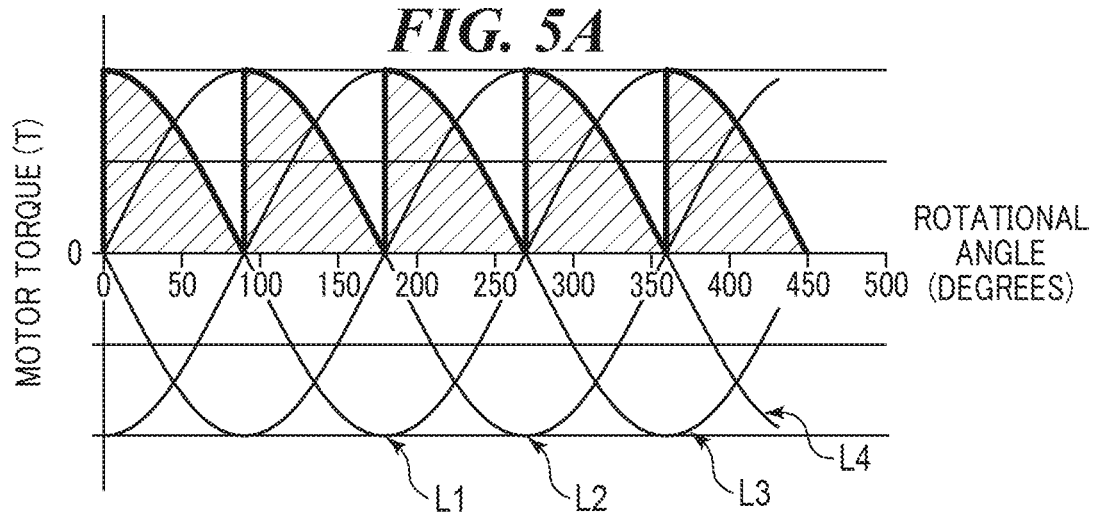
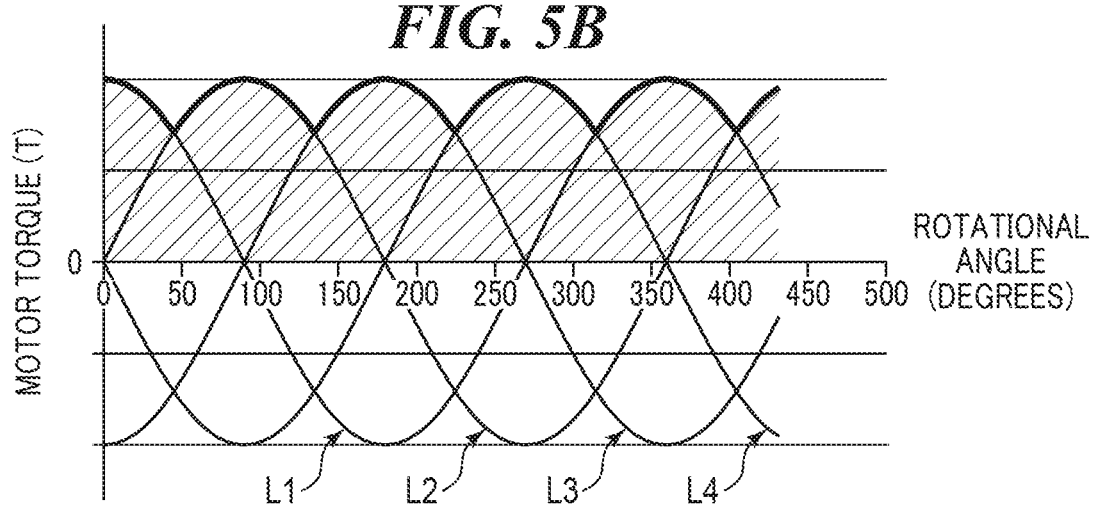
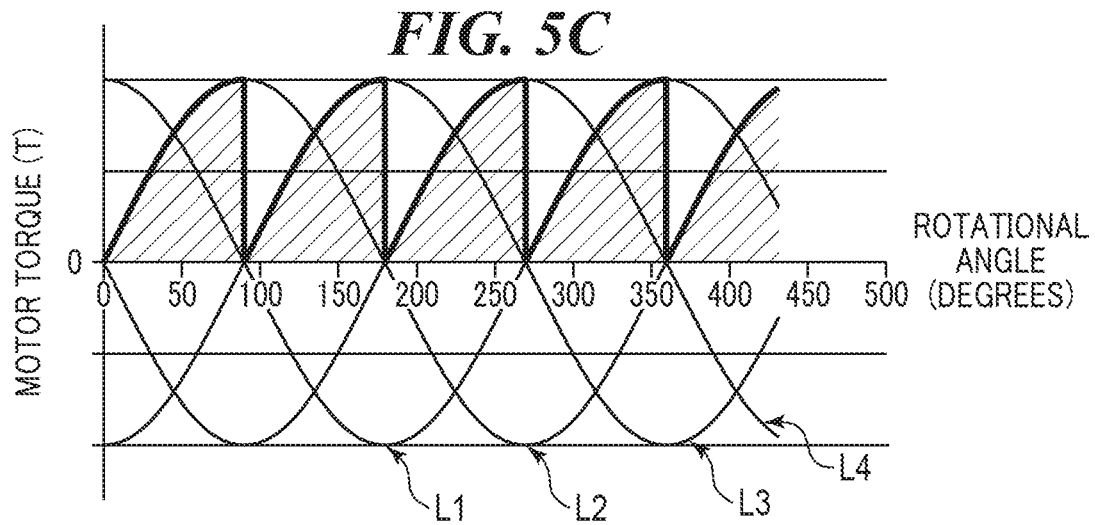

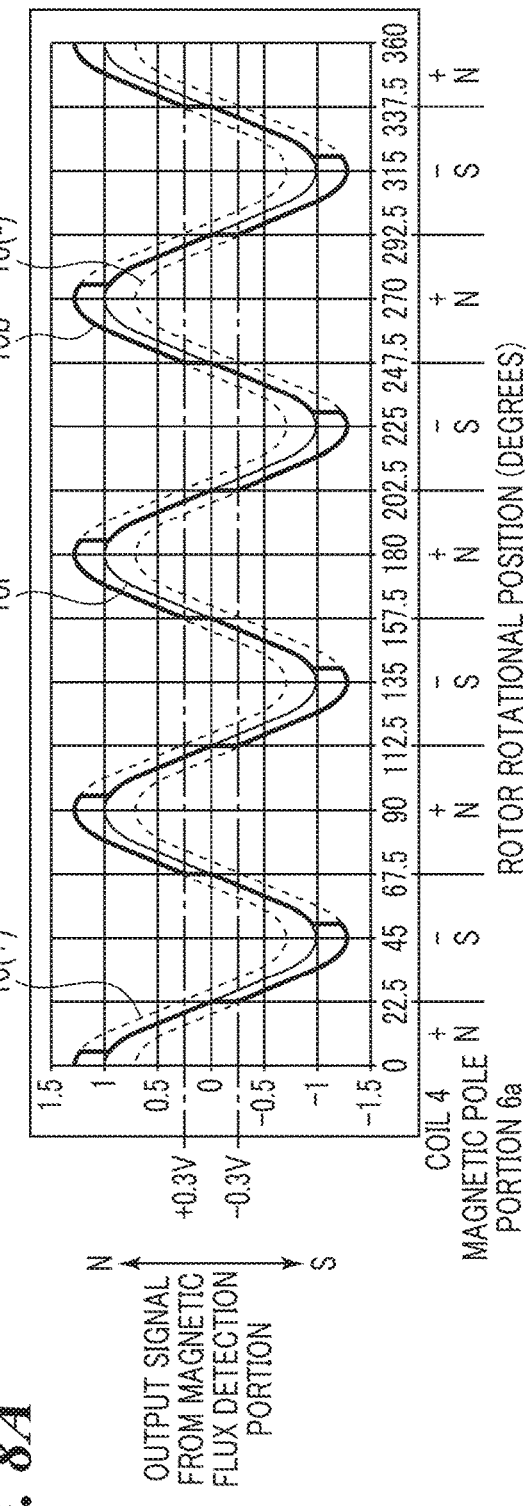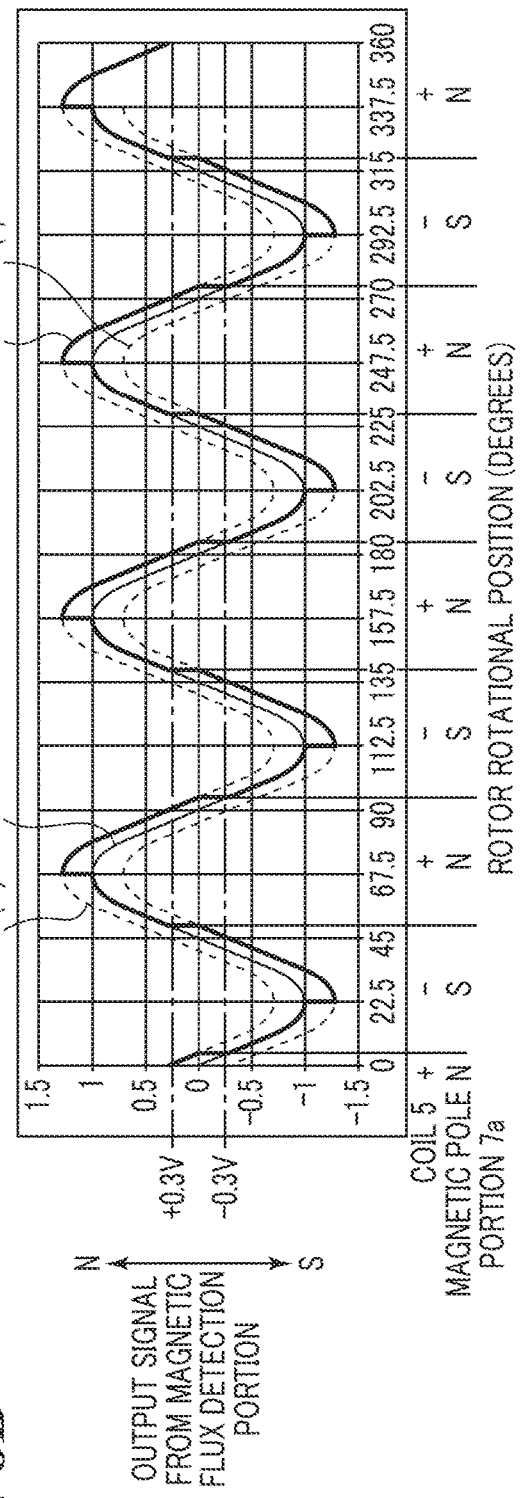

FIG. 10

| ROTATIONAL POSITION OF ROTOR 3 (MECHANICAL ANGLE) | ROTATIONAL POSITION OF ROTOR 3 (ELECTRICAL ANGLE) | POLARITY OF VOLTAGE APPLIED TO COIL 4 | MAGNETIC POLE OF MAGNETIC POLE PORTION 6a | POLARITY OF VOLTAGE APPLIED TO COIL 5 | MAGNETIC POLE OF MAGNETIC POLE PORTION 7a | FIRST REFERENCE SIGNAL 300 | SECOND REFERENCE SIGNAL 301 |
|---|---|---|---|---|---|---|---|
| 0 DEGREES →22.5 DEGREES | 0 DEGREES →90 DEGREES | + | N | − | S | 0V | 0V (−0.3V) |
| 22.5 DEGREES →45 DEGREES | 90 DEGREES →180 DEGREES | − | S | − | S | 0V | −0.3V |
| 45 DEGREES →67.5 DEGREES | 180 DEGREES →270 DEGREES | − | S | + | N | 0V | 0V (+0.3V) |
| 67.5 DEGREES →90 DEGREES | 270 DEGREES →360 DEGREES | + | N | + | N | 0V | +0.3V |

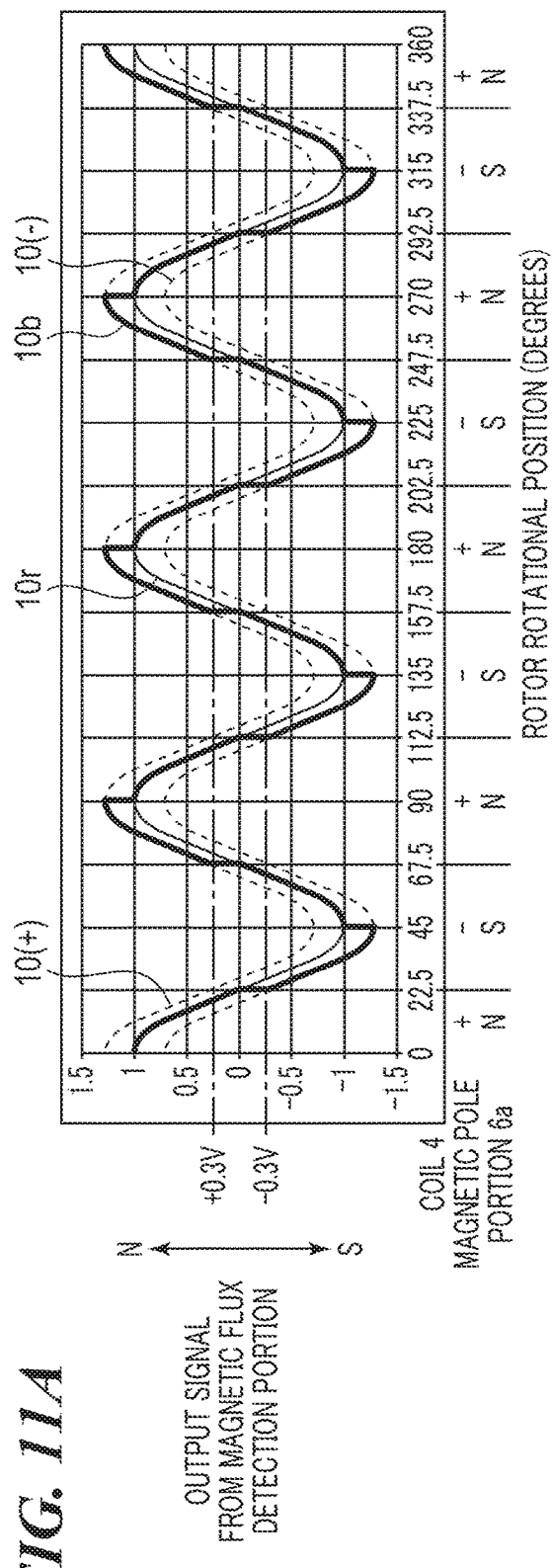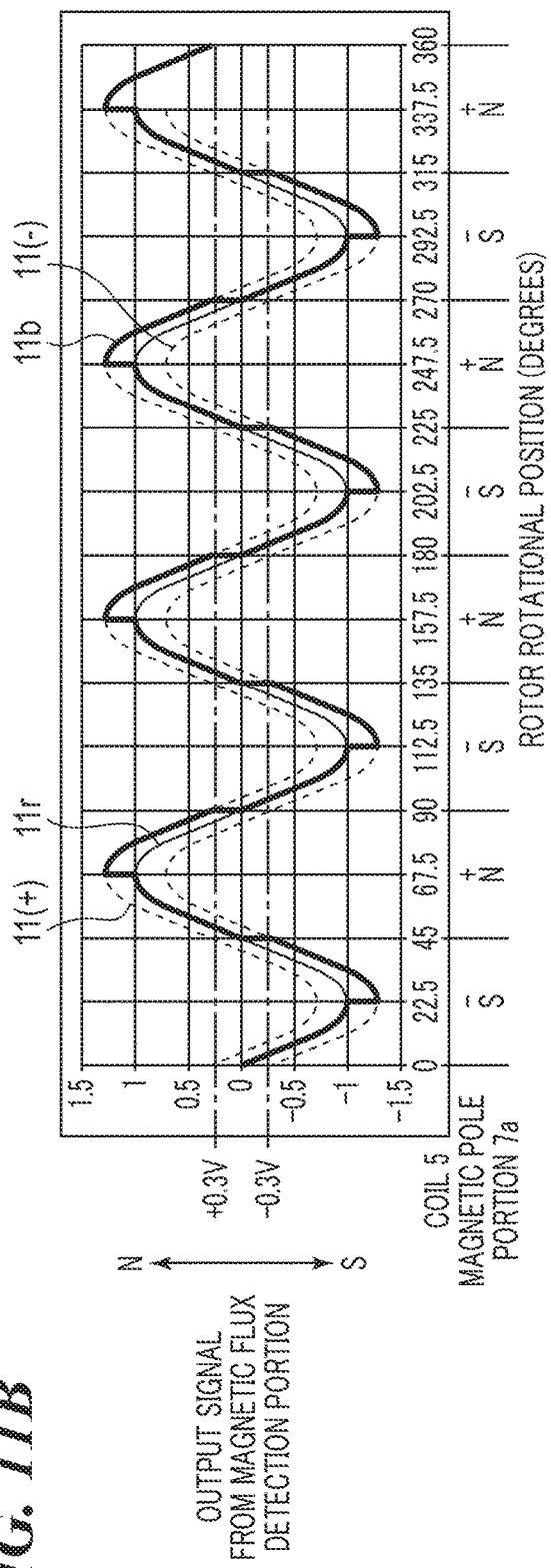

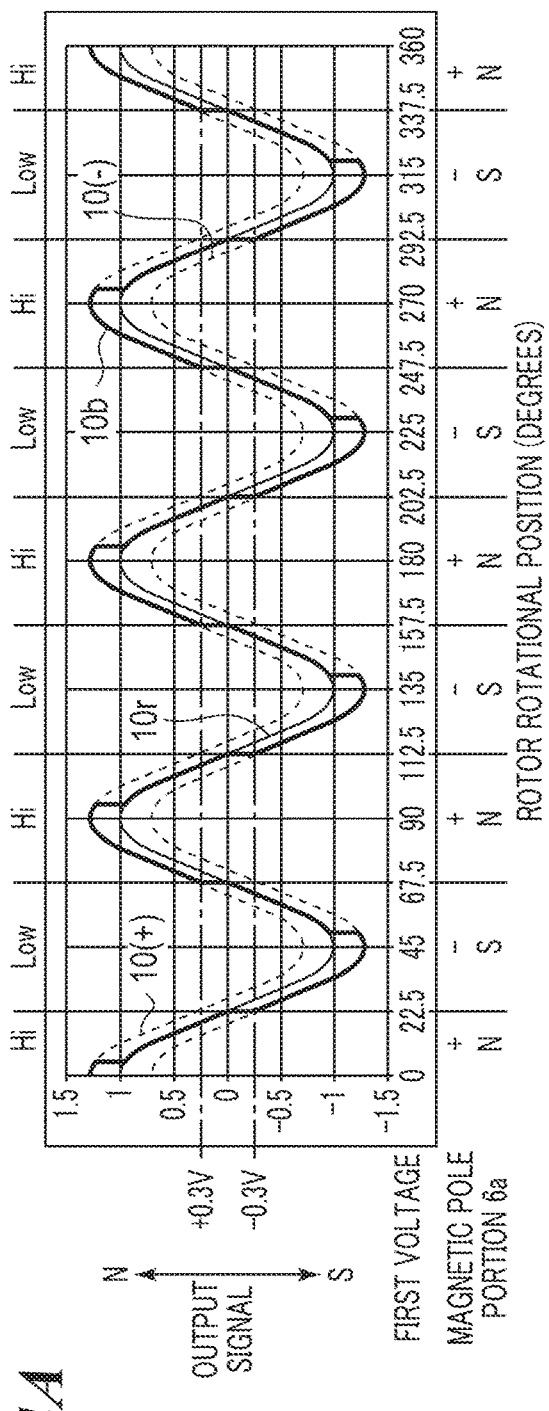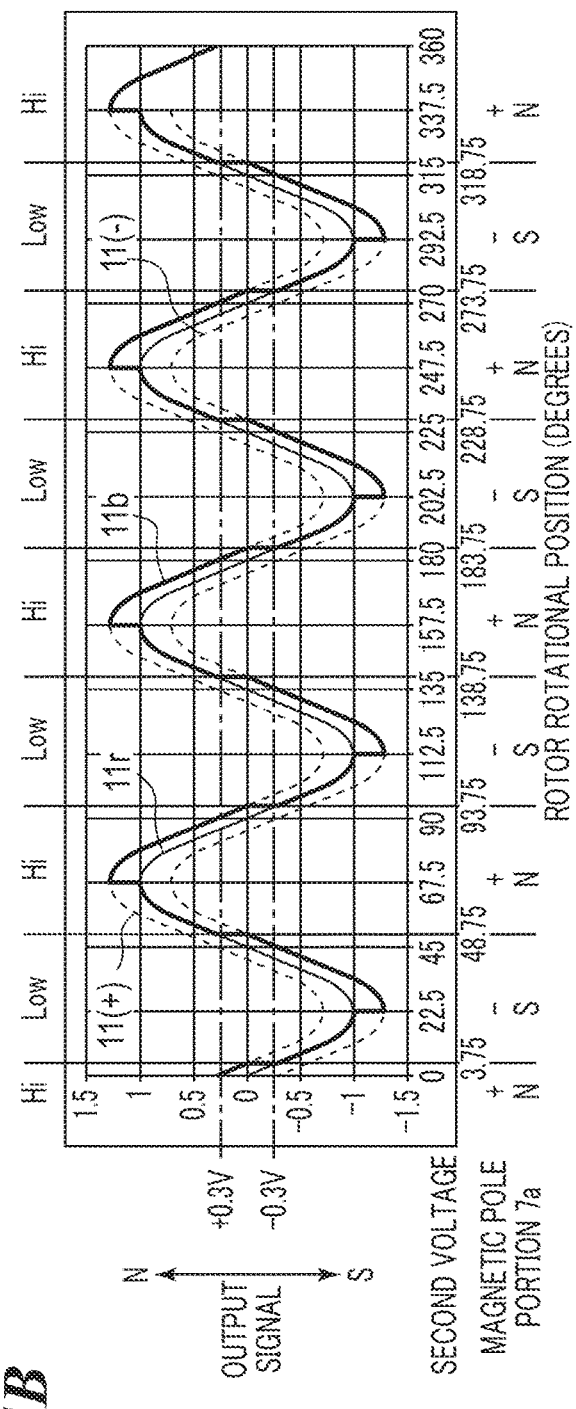

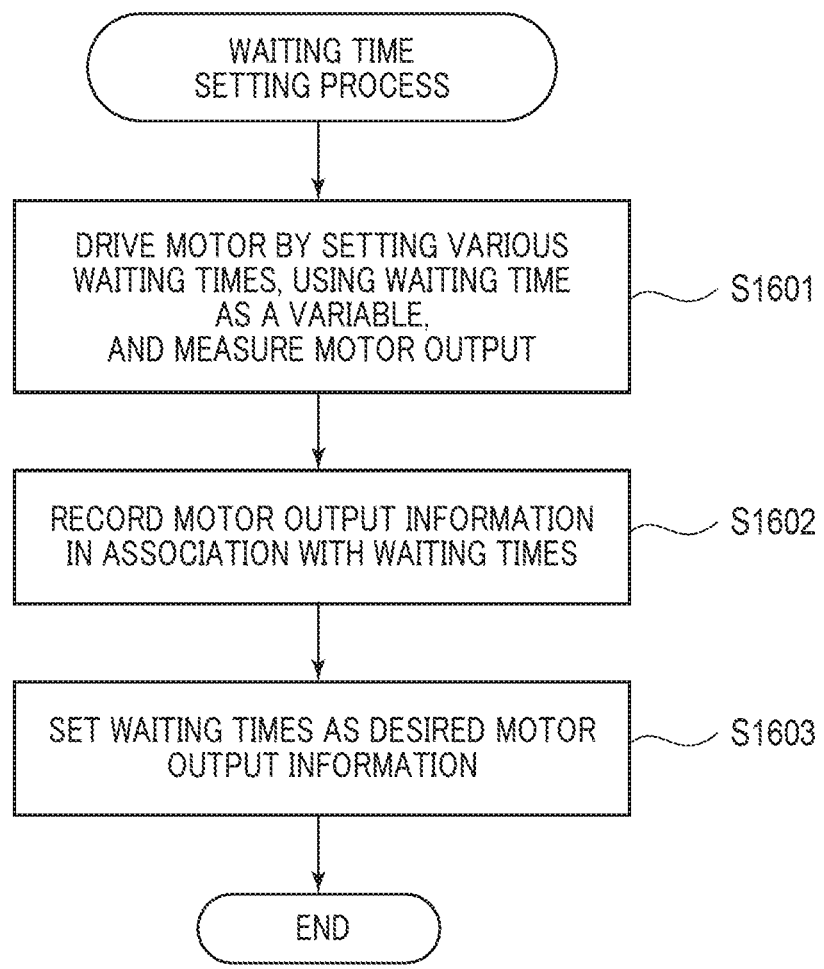

MOTOR CONTROL APPARATUS AND MOTOR CONTROL METHOD FOR REDUCING INFLUENCE OF MAGNETIC FLUXES FROM YOKES

BACKGROUND OF THE INVENTION

Field of the Invention

The present invention relates to a motor control apparatus and a motor control method.

Description of the Related Art

A stepping motor has features, such as small size, high torque, and long service life, and is capable of easily realizing digital positioning operation by open loop control, and hence is widely used for information appliances, such as cameras and optical disk devices, office automation equipment, such as printers and projectors, and so forth. However, during high-speed rotation of the motor or when load on the motor is large, the motor can be in the failure of loss of synchronization, and there has been a problem that the stepping motor is lower in efficiency than a brushless motor or a DC motor. To solve this problem, it is known to prevent the loss of synchronization by attaching an encoder to the stepping motor and causing the motor to perform an operation of a so-called brushless DC motor in which energization is switched according to the position of a rotor.

Japanese Laid-Open Patent Publication (Kokai) No. 2014-128143 discloses a motor control apparatus that detects the position of a rotor by magnetic sensors, and sequentially switches energization of coils. In the motor control apparatus disclosed in Japanese Laid-Open Patent Publication (Kokai) No. 2014-128143, a motor thereof includes a magnetic sensor disposed to set excitation switching time between electrical advanced angles of 0 degrees to 45 degrees, and a magnetic sensor disposed to set the excitation switching time between electrical advanced angles of 45 degrees to 90 degrees. Further, a magnet of the motor is multipolar magnetized so that an N pole and an S pole alternate in a circumferential direction. In the motor control apparatus disclosed in Japanese Laid-Open Patent Publication (Kokai) No. 2014-128143, the switching between the N pole and the S pole of the magnet is detected by the magnetic sensors according to the rotation of the rotor, whereby the energization of the coils is sequentially switched.

Originally, it is desirable that the magnetic sensors detect only magnetic fluxes from the magnet of the rotor. However, there is a case where the magnetic sensors detect magnetic fluxes from yokes, depending on energized states of two coils. In this case, the magnetic sensors cannot accurately detect the switching between the N pole and the S pole of the magnet, which can cause a time deviation from an intended energization switching time of the coils. This brings about a problem that the time deviation causes deviation of actually generated torque from intended torque.

SUMMARY OF THE INVENTION

The present invention provides a motor control apparatus and a motor control method for reducing the influence of magnetic fluxes from yokes on the switching of an energization direction.

In a first aspect of the present invention, there is provided a motor control apparatus for controlling a motor that includes a rotor that is rotatable and includes a magnet circumferentially divided into a plurality of portions alternately multipolar magnetized to different poles, a first yoke that has a first magnetic pole portion opposed to an outer peripheral surface of the rotor, a second yoke that has a second magnetic pole portion opposed to the outer peripheral surface of the rotor and disposed at a location shifted in electrical angle from the first magnetic pole portion, a first coil that is energized to excite the first magnetic pole portion, a second coil that is energized to excite the second magnetic pole portion, and a magnetic sensor that is disposed in an opposed relation to the outer peripheral surface of the rotor, for outputting a signal according to a magnetic flux, the motor control apparatus comprising a comparator that outputs a comparison result signal indicative of a result of comparison between the output signal from the magnetic sensor and a reference signal, and a control circuit that controls energization directions of the first coil and the second coil based on the comparison result signal output from the comparator, and wherein the control circuit changes a value of the reference signal according to a relationship between a polarity of the first magnetic pole portion and a polarity of the second magnetic pole portion.

In a second aspect of the present invention, there is provided a motor control apparatus for controlling a motor that include a rotor that is rotatable and includes a magnet circumferentially divided into a plurality of portions alternately multipolar magnetized to different poles, a first yoke that has a first magnetic pole portion opposed to an outer peripheral surface of the rotor, a second yoke that has a second magnetic pole portion opposed to the outer peripheral surface of the rotor and disposed at a location shifted in electrical angle from the first magnetic pole portion, a first coil that is energized to excite the first magnetic pole portion, a second coil that is energized to excite the second magnetic pole portion, and a magnetic sensor that is disposed in an opposed relation to the outer peripheral surface of the rotor, for outputting a signal according to a magnetic flux, the motor control apparatus comprising a control circuit that switches an energization direction of the first coil or the second coil when a waiting time elapses after a sign of the output signal from the magnetic sensor is inverted, wherein the control circuit sets the waiting time according to a relationship between a polarity of the first magnetic pole portion and a polarity of the second magnetic pole portion.

In a third aspect of the present invention, there is provided a method of controlling a motor that includes a rotor that is rotatable and includes a magnet circumferentially divided into a plurality of portions alternately multipolar magnetized to different poles, a first yoke that has a first magnetic pole portion opposed to an outer peripheral surface of the rotor, a second yoke that has a second magnetic pole portion opposed to the outer peripheral surface of the rotor and disposed at a location shifted in electrical angle from the first magnetic pole portion, a first coil that is energized to excite the first magnetic pole portion, a second coil that is energized to excite the second magnetic pole portion, and a magnetic sensor that is disposed in an opposed relation to the outer peripheral surface of the rotor, for outputting a signal according to a magnetic flux, the method comprising outputting a comparison result signal indicative of a result of comparison between the output signal from the magnetic sensor and a reference signal, controlling energization directions of the first coil and the second coil based on the output comparison result signal, and changing a value of the reference signal according to a relationship between a polarity of the first magnetic pole portion and a polarity of the second magnetic pole portion.

In a fourth aspect of the present invention, there is provided a method of controlling a motor that includes a rotor that is rotatable and includes a magnet circumferentially divided into a plurality of portions alternately multipolar magnetized to different poles, a first yoke that has a first magnetic pole portion opposed to an outer peripheral surface of the rotor, a second yoke that has a second magnetic pole portion opposed to the outer peripheral surface of the rotor and disposed at a location shifted in electrical angle from the first magnetic pole portion, a first coil that is energized to excite the first magnetic pole portion, a second coil that is energized to excite the second magnetic pole portion, and a magnetic sensor that is disposed in an opposed relation to the outer peripheral surface of the rotor, for outputting a signal according to a magnetic flux, the method comprising switching an energization direction of the first coil or the second coil when a waiting time elapses after a sign of the output signal from the magnetic sensor is inverted, and setting the waiting time according to a relationship between a polarity of the first magnetic pole portion and a polarity of the second magnetic pole portion.

According to the present invention, it is possible to reduce the influence of magnetic fluxes from yokes on the switching of an energization direction.

Further features of the present invention will become apparent from the following description of exemplary embodiments (with reference to the attached drawings).

BRIEF DESCRIPTION OF THE DRAWINGS

FIG. 3 is a diagram showing a relationship between a rotational angle of a rotor and torque of the motor, which holds when predetermined electric currents are passed through coils of the motor.
FIGS. 5A to 5C are diagrams showing motor torques generated according to energized states of first and second coils with respect to the rotational angle of the rotor.
FIGS. 8A and 8B are diagrams showing relationships between rotational positions of the rotor, energizing polarities of the coils, and output signals during right rotation of the rotor.
FIG. 10 is a table of rotational positions of the rotor, polarities of voltages applied to the coils, magnetic poles of magnetic pole portions, and settings of reference signals during right rotation of the rotor.
FIGS. 11A and 11B are diagrams showing relationships between the rotational positions of the rotor, the energizing polarities of the coils, and the output signals during right rotation of the rotor.
FIGS. 14A and 14B are diagrams showing the relationships between the rotational positions of the rotor, the energizing polarities of the coils, and the output signals, during right rotation of the rotor, together with comparison result signals added thereto.
FIG. 16 is a flowchart of a waiting time setting process.

DESCRIPTION OF THE EMBODIMENTS

The present invention will now be described in detail below with reference to the accompanying drawings showing embodiments thereof.

Figure 1:
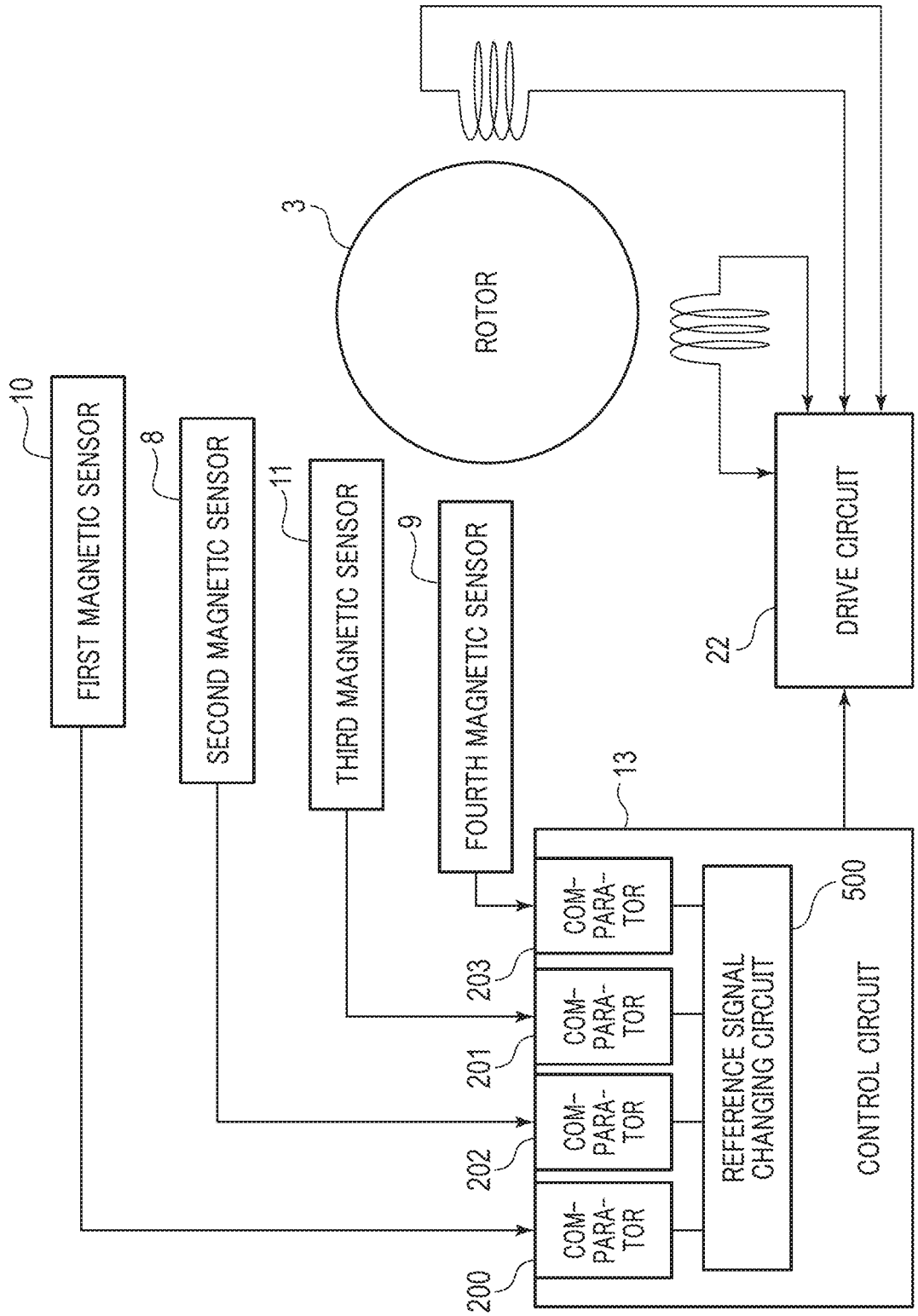
FIG. 1 is a block diagram of a motor control apparatus.
Figure 2:
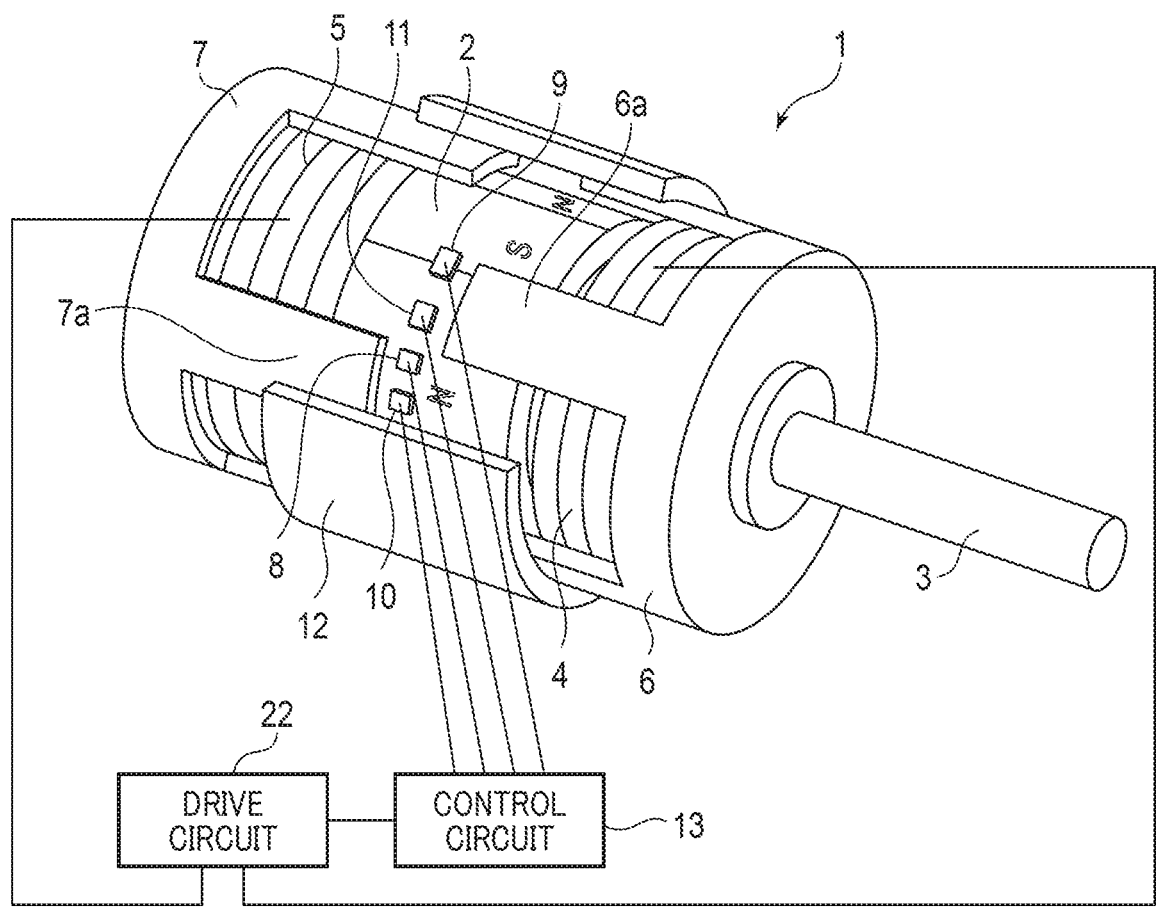
FIG. 2 is a perspective view of the appearance of a motor.

FIG. 1 is a block diagram of a motor control apparatus according to a first embodiment of the present invention. FIG. 2 is a perspective view of the appearance of a motor. In FIG. 2, the motor is shown with some components broken away, for convenience of explanation. The motor control apparatus is comprised of the motor, denoted by reference numeral 1, a drive circuit 22, and a control circuit 13. The control circuit 13 includes a CPU, a ROM, and a RAM (none of which are shown). The motor 1 includes a rotor 3, a first coil 4, a first yoke 6, a second coil 5, and a second yoke 7. Further, the motor 1 includes a first magnetic sensor 10 (first magnetic sensor), a second magnetic sensor 8, a third magnetic sensor 11 (second magnetic sensor), and a fourth magnetic sensor 9. The control circuit 13 includes a reference signal changing circuit 500, and comparators 200, 201, 202, and 203 which are connected to the reference signal changing circuit 500. The control circuit 13 controls the reference signal changing circuit 500, and switches reference signals delivered from the reference signal changing circuit 500. The comparators 200, 202, 201, and 203 are connected to the magnetic sensors 10, 8, 11, and 9, respectively.

The rotor 3 includes a magnet 2, and is rotatably controlled by the control circuit 13 via the drive circuit 22. The magnet 2 is formed into a cylindrical shape, and an outer peripheral surface thereof is subjected to multipolar magnetization by circumferentially dividing the same into a plurality of portions and alternately magnetizing the portions to different poles. In the present embodiment, the magnet 2 is divided into eight portions, i.e. is magnetized to eight poles (four N poles and four S poles). Note that the number of magnetized poles is not limited to eight, but for example, it may be two, four, or twelve or more.

The first coil 4 is disposed at one end of the magnet 2 in an axial direction thereof. The first yoke 6 is made of a soft magnetic material, and is arranged in an opposed relation to the outer peripheral surface of the magnet 2 with a gap therebetween. The first yoke 6 includes a plurality of first magnetic pole portions 6a which are opposed to the outer peripheral surface of the magnet 2. The first magnetic pole portions 6a extend from an annular shaped main body of the first yoke 6 in the axial direction, and are arranged at predetermined space intervals in the circumferential direction. The first magnetic pole portions 6a are excited by energizing the first coil 4. The first coil 4, the first yoke 6, and the magnet 2 opposed to the first magnetic pole portions 6a form a "first stator unit".

The second coil 5 is arranged at the other end of the magnet 2 which is axially opposite from the one end of the magnet 2 where the first coil 4 is arranged. The second yoke 7 is made of a soft magnetic material, and is arranged in an opposed relation to the outer peripheral surface of the magnet 2 with a gap therebetween. The second yoke 7 includes a plurality of second magnetic pole portions 7a which are opposed to the outer peripheral surface of the magnet 2. The second magnetic pole portions 7a extend from an annular shaped main body of the second yoke 7 in the axial direction, and are arranged at predetermined space intervals in the circumferential direction. The second magnetic pole portions 7a are excited by energizing the second coil 5. Each second magnetic pole portion 7a is disposed at a phase different from a relative phase between the first yoke 6 and magnet 2. The second coil 5, the second yoke 7, and the magnet 2 opposed to the second magnetic pole portions 7a form a "second stator unit".

The control circuit 13 is capable of changing a torque given to the rotor 3 by switching the poles (N poles and S poles) excited by the first magnetic pole portions 6a and second magnetic pole portions 7a, respectively. The control circuit 13 applies voltages having the same magnitude to the first coil 4 and the second coil 5 when energizing the first coil 4 and the second coil 5. Further, the coils and the yokes are designed such that in the case where the control circuit 13 cause a voltage of the same magnitude to be applied to each of the first coil 4 and the second coil 5, the first magnetic pole portions 6a and the second magnetic pole portions 7a have the same magnetic strength The first magnetic sensor 10, the second magnetic sensor 8, the third magnetic sensor 11, and the fourth magnetic sensor 9 are all Hall elements for detecting a magnetic flux from the magnet 2, and are fixed to a motor cover 12. As the rotor 3 rotates one turn, the magnetic sensors alternately detect the N poles and the S poles of the magnet 2, and sequentially deliver signals indicative of the detected eight poles. These signals make it possible to detect the rotational position of the rotor 3. The motor cover 12 fixedly holds the first yoke 6 and the second yoke 7 such that the first magnetic pole portions 6a and the second magnetic pole portions 7a are disposed with a shift of an electrical angle of approximately 90 degrees with respect to the magnetization phase of the magnet 2. Here, the term "electrical angle" as used herein means an angle expressed by regarding one period of changes in the magnetic force of the magnet 2 as 360 degrees. Assuming that the number of magnetic poles of the rotor 3 is represented by M, and a mechanical angle thereof is represented by θ0, the electrical angle θ can be expressed by the following equation (1):

$$\theta = \theta_0 \times M/2 \quad (1)$$

In the illustrated example, since the magnet 2 is magnetized to eight poles, an electrical angle of 90 degrees is equal to a mechanical angle of 22.5 degrees. In the following description, the operation of a feedback energization switching mode will be described mainly based on electrical angles.

FIG. 3 is a diagram showing a relationship between the rotational angle of the rotor 3 and the torque of the motor 1, which holds when predetermined electric currents are passed through the coils of the motor 1. In FIG. 3, the horizontal axis represents electrical angle, and the vertical axis represents motor torque. As to the sign of the motor torque, the motor torque causing the rotor 3 to rotate clockwise, as viewed in FIGS. 1 and 4, is defined as positive (+).

Figure 4A:
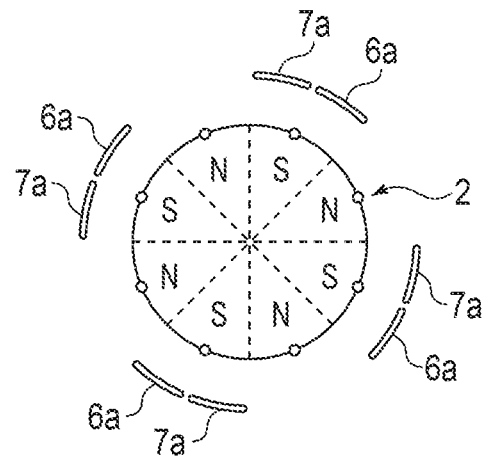
FIGS. 4A and 4B are schematic cross-sectional views of the motor taken along a direction perpendicular to the axis thereof, which shows phase relationships between yokes and a magnet
Figure 4B:
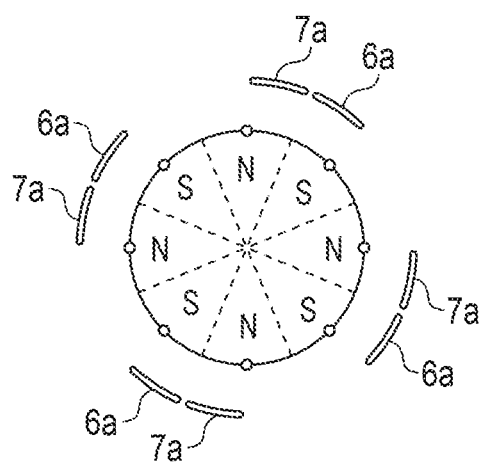

FIGS. 4A and 4B are schematic cross-sectional views of the motor 1 taken along a direction perpendicular to the axis thereof, which shows phase relationships between the yokes and the magnet 2. In the present embodiment, it is assumed that when an electric current in the positive direction is passed through the first coil 4, the first magnetic pole portions 6a are excited to the N pole, whereas when an electric current in the positive direction is passed flow through the second coil 5, the second magnetic pole portions 7a are excited to the N pole.

The phase relationship shown in FIG. 4A is denoted by symbol "a" in FIG. 3. FIG. 4A shows a state in which a distance between the center of a magnetized pole of the magnet 2 and the center of an opposed one of the first magnetic pole portions 6a in the circumferential direction is equal to a distance between the center of the magnetized pole of the magnet 2 and the center of an opposed one of the second magnetic pole portions 7a in the circumferential direction. In the state shown in FIG. 4A, the S poles of the magnet 2 are attracted by the N poles of the first magnetic pole portions 6a and the N poles of the second magnetic pole portions 7a with equal magnetic forces, and hence a force for holding a rotational phase (rotational position) is generated, but a rotational driving force is not generated.

From the state shown in FIG. 4A, when the energization of the second magnetic pole portions 7a is switched such that they are excited to the S pole, the rotor 3 is rotated to a state shown in FIG. 4B. In the FIG. 4B state, similar to the state shown in FIG. 4A, a force for holding a rotational phase is generated, no rotational driving force is generated. That is, the S poles of the magnet 2 are attracted by the N poles of the first magnetic pole portions 6a, and the N poles of the magnet 2 are attracted by the S poles of the second magnetic pole portions 7a, with equal magnetic forces. By sequentially switching the respective directions of energizing the first coil 4 and the second coil 5 hereafter in the same manner as described above to thereby switch the polarities of the first magnetic pole portions 6a and the second magnetic pole portions 7a, it is possible to cause the rotor 3 to rotate.

The switching of the poles to which the first and second magnetic pole portions 6a and 7a are excited at such time that no rotational driving force is generated is defined as the "energization switching with an electrical advance angle of 0 degrees". Further, the switching of the poles to which the first and second magnetic pole portions 6a and 7a are excited at earlier time than the above time by an electrical angle of γ degrees is defined as the "energization switching with an electrical advance angle of γ degrees".

In each of FIGS. 5A to 5C, the vertical axis represents motor torque generated according to the energized states of the first coil 4 and the second coil 5 with respect to the rotational angle of the rotor 3, and the horizontal axis represents electrical angle.

A curved line L1 indicates a motor torque generated in a case where the energization direction of the first coil 4 is positive (+), and the energization direction of the second coil 5 is positive (+). A curved line L2 indicates a motor torque generated in a case where the energization direction of the first coil 4 is positive (+), and the energization direction of the second coil 5 is opposite, i.e. negative (−). A curved line L3 indicates a motor torque generated in a case where the energization direction of the first coil 4 is opposite, i.e. negative (−), and the energization direction of the second coil 5 is opposite, i.e. negative (−). A curve L4 indicates a motor torque generated in a case where the energization direction of the first coil 4 is opposite (+), and the energization direction of the second coil 5 is positive, i.e. negative (−).

FIG. 5A shows a state where the electrical advance angle is 0 degrees. In a case where the energization directions of the coils are switched at such time, at a phase immediately before switching the energization directions of the coils, the motor torque is very small, as indicated by hatched areas and bold lines, and hence the output of the motor 1 does not become large. FIG. 5B shows a state where the electrical advance angle is 45 degrees. In a case where the electrical advance angle is 45 degrees, a motor torque generated at the time of switching the energization directions of the coils is maximized. Further, in a case where the switching time is advanced to switch the energization directions of the coils at an electrical advance angle of 90 degrees, the motor torque is as indicated by hatched areas in FIG. 5C, and as a consequence, similar to the case of the electrical advance angle being 0 degrees, it is impossible to obtain a large rotational driving force.

As described above, in the case of the electrical advance angle being 45 degrees, the motor torque is maximized. When the motor torque is desired to be reduced, it is only required to shift the electrical advance angle from 45 degrees toward 0 or 90 degrees, to thereby change the angle e.g. to 40 or 50 degrees, according to desired torque. Further, even when the energization of the coils is switched, electric current is not immediately switched to a predetermined current value, but it becomes closer to the predetermined current value while gradually increasing in magnitude. By taking this transitional response of electric current into account, it is possible to obtain the largest torque by advancing the switching time such that the energization of the coils is switched at earlier time than the electrical advance angle of 45 degrees, e.g. by 24 degrees (at an electrical advance angle of 69 degrees), though depending on the case.

Next, a description will be given of the influence of the polarities of the magnetic pole portions on the magnetic sensors. In the present embodiment, the position of the rotor 3 is detected by the magnetic sensors 8 to 11, and a desired electrical advance angle is realized by the positions of the magnetic sensors 8 to 11.

Figure 6A:
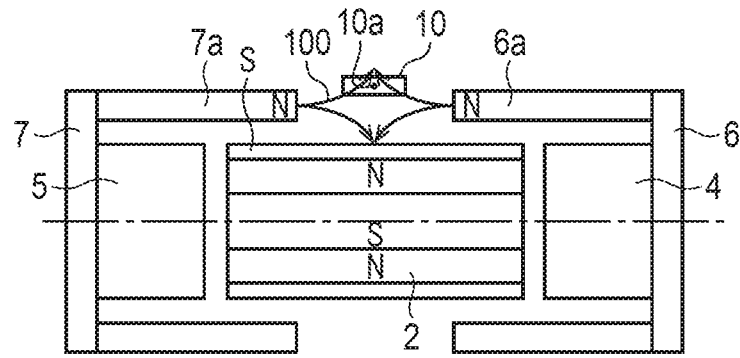
FIG. 6A is a cross-sectional view schematically showing a positional relationship between yokes, a magnetic sensor, and the magnet.
Figure 6B:
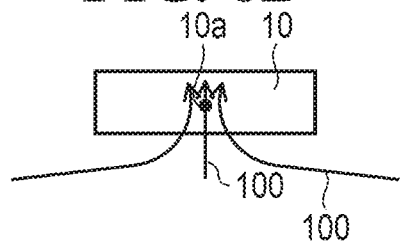
FIG. 6B is an enlarged view of the magnetic sensor.
Figure 6C:
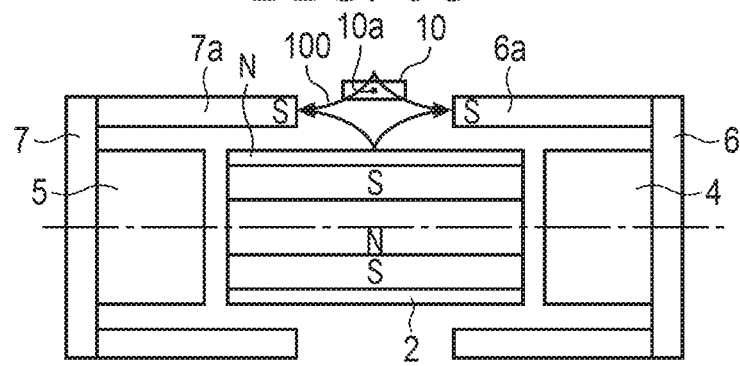
FIG. 6C is a cross-sectional view schematically showing a positional relationship between the yokes, the magnetic sensor, and the magnet.
Figure 6D:
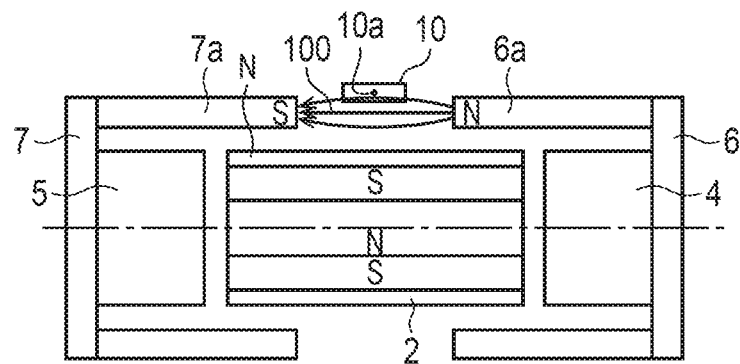
FIG. 6D is a cross-sectional view schematically showing a positional relationship between the yokes, the magnetic sensor, and the magnet.
Figure 7:
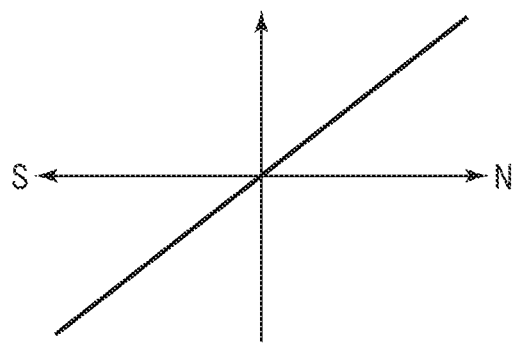
FIG. 7 is a diagram showing a relationship between magnetic force lines and an output signal from the magnetic sensor.

FIGS. 6A, 6C, and 6D are cross-sectional views schematically showing positional relationships between the yokes, a magnetic sensor, and the magnet. FIG. 6B is an enlarged view of the magnetic sensor. FIG. 7 is a diagram showing a relationship between the magnetic force line and the output signal from the magnetic sensor. The magnetic sensors 8 to 11 (the magnetic sensor 10 appears in FIGS. 6A to 6D) are located between the first magnetic pole portions 6a and the second magnetic pole portions 7a in the axial direction of the magnet 2 (in different phases). All the magnetic sensors 8 to 11 are disposed at respective locations more outward in the radial direction of the magnet 2 than the first and second magnetic pole portions 6a and 7a. More specifically, the center positions of the first and second magnetic pole portions 6a and 7a are the same in the radial direction of the magnet 2, but the center positions of the magnetic sensors 8 to 11 (or the positions of magnetic flux detection portions thereof) are located more outward in the radial direction of the magnet 2 than the center positions of the first and second magnetic pole portions 6a and 7a. It is sometimes inevitable to arrange the magnetic sensors 8 to 11 as described above, due to a relationship between the arrangements of the magnetic sensors 8 to 11 and those of other component parts, and constraints of industrial accuracy.

The following description is given by paying attention to the first magnetic sensor 10, as a representative. The first magnetic sensor 10 implemented by a Hall element contains a magnetic flux detection portion 10a for detecting magnetism (FIG. 6B). In the example illustrated in FIG. 6A, the first and second coils 4 and 5 are energized such that both the first magnetic pole portions 6a of the first yoke 6 and the second magnetic pole portions 7a of the second yoke 7 are each excited to the N pole. S-pole portions of the magnet 2 of the rotor 3 are attracted by the N poles of the first and second magnetic pole portions 6a and 7a, and are moved closer thereto.

Figure 9A:
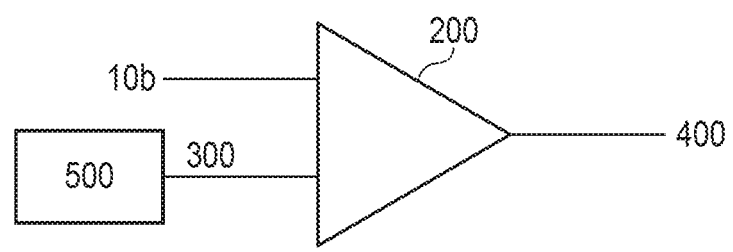
FIGS. 9A and 9B are respective schematic diagrams of a first comparator and a second comparator.
Figure 9B:
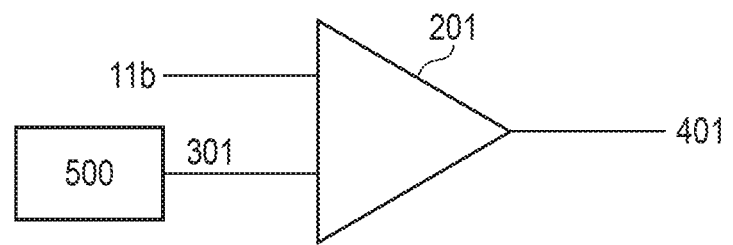

The first magnetic sensor 10 delivers a first output signal 10b as a signal corresponding to a magnetic flux detected by the magnetic flux detection portion 10a (FIGS. 8A and 9A). Similarly, the third magnetic sensor 11 as well delivers a second output signal 11b (FIGS. 8B and 9B). As shown in FIG. 7, when the magnetic flux detection portion 10a detects a magnetic force line indicating a direction of magnetism from the N pole to the S pole, which extends upward, as viewed in FIG. 6B (radially outward of the magnet 2), the first magnetic sensor 10 outputs a + (positive) voltage as the first output signal 10b. Inversely, when the magnetic flux detection portion 10a detects a magnetic force line indicating a direction of magnetism from the N pole to the S pole, which extends downward, as viewed in FIG. 6B (radially inward of the magnet 2), the first magnetic sensor 10 outputs a − (negative) voltage as the first output signal 10b. The first magnetic sensor 10 has characteristics that the magnitude of the voltage varies with the magnitude of the magnetic force, and hence the sensor 10 outputs a high voltage in a case where the magnetic force is large, whereas in a case where the magnetic force is small, it outputs a low voltage.

Although the magnetic flux detection portion 10a is provided for detecting a radial (vertical, as viewed in FIG. 6B) magnetic flux from the magnet 2, it also detects magnetic fluxes from the first and second magnetic pole portions 6a and 7a of the first and second yokes 6 and 7. In a case where both the first and second magnetic pole portions 6a and 7a are excited to N poles, as shown in FIG. 6A, magnetic force lines 100 repelling each other are generated by the first and second magnetic pole portions 6a and 7a. Assuming that the magnetic flux detection portion 10a can be disposed at a location where the magnetic force lines 100 would be oriented in a direction orthogonal to the radial direction (left-right direction, as viewed in FIG. 6A) (e.g. the center positions of the first and second magnetic pole portions 6a and 7a in the radial direction of the magnet 2), it is possible to prevent detection of the magnetic force lines 100 from the first and second magnetic pole portions 6a and 7a. However, as mentioned hereinabove, it is difficult to realize such an arrangement due to various constraints.

In the example illustrated in FIG. 6A, since the magnetic flux detection portion 10a is disposed radially more outward than the location where the magnetic force lines 100 would not be detected, as shown in FIG. 6B, the magnetic force lines 100 are oriented outward at the location of the magnetic flux detection portion 10a. Since the first magnetic sensor 10 detects not only the magnetic flux from the magnet 2 but also magnetic force lines 100 from the first and second yokes 6 and 7 oriented outward, the first output signal 10b delivered from the first magnetic sensor 10 shifts toward a + (positive) side compared with a case where there are no magnetic force lines 100.

On the other hand, in the example illustrated in FIG. 6C, the first and second coils 4 and 5 are energized such that both the first and second magnetic pole portions 6a and 7a are each excited to the S pole. In this case, the magnetic force lines 100 are oriented toward the first and second magnetic pole portions 6a and 7a from above and below, as viewed in FIG. 6C, and the magnetic force lines 100 are oriented downward at the location of the magnetic flux detection portion 10a. Since the first magnetic sensor 10 detects not only the magnetic flux from the magnet 2 but also the magnetic force lines 100 from the first and second yokes 6 and 7 oriented inward, the first output signal 10b delivered from the first magnetic sensor 10 shifts toward a – (negative) side compared with the case where there are no magnetic force lines 100.

In the example illustrated in FIG. 6D, the first and second coils 4 and 5 are energized such that the first magnetic pole portions 6a are each excited to the N pole, and the second magnetic pole portions 7a are each excited to the S pole. The magnetic poles of the first and second magnetic pole portions 6a and 7a have the same strength of magnetism. The magnetic force lines 100 are oriented in the left-right direction, as viewed in FIG. 6D, in which the sensitivity of the first magnetic sensor 10 is low. In such a state, even when the location of the first magnetic sensor 10 is slightly displaced in the radial direction, the magnetic force lines 100 have little influence on the first output signal 10b from the first magnetic sensor 10. Similarly, also in a case where the first and second coils 4 and 5 are energized such that the first magnetic pole portions 6a are each excited to the S pole, and the second magnetic pole portions 7a are each excited to the N pole, the magnetic force lines 100 are oriented in a direction in which the sensitivity of the first magnetic sensor 10 is low, and hence the magnetic force lines 100 have little influence on the first output signal 10b. That is, in the case where the polarities of the first and second magnetic pole portions 6a and 7a are different, since the magnetic force lines 100 are oriented in the direction in which the sensitivity of the first magnetic sensor 10 is low, the influence of the magnetic force lines 100 on the first output signal 10b is little.

Since the magnetic flux detection portions of the other magnetic sensors 8, 9, and 11 are also disposed radially more outward than the location where the magnetic force lines 100 are not detected, output signals from the magnetic sensors 8, 9, and 11 have the same tendency as the first output signal 10b from the first magnetic sensor 10.

FIGS. 8A and 8B are diagrams showing relationships between the rotational positions of the rotor 3, energizing polarities of the coils 4 and 5, and the first and second output signals 10b and 11b, in a case where the rotor 3 is caused to perform right rotation (clockwise rotation, as viewed in FIGS. 4A and 4B). Particularly, FIG. 8A shows the output signal from the first magnetic sensor 10, and FIG. 8B shows the output signal from the third magnetic sensor 11. As disclosed in Japanese Laid-Open Patent Publication (Kokai) No. 2014-128143, by changing association between the coils of which the energizing polarities are switched and the magnetic sensors, it is possible to obtain various generated torques. In the present embodiment, the motor 1 is driven by switching energization of the first coil 4 based on the first magnetic sensor 10, and switching energization of the second coil 5 based on the third magnetic sensor 11.

In each of FIGS. 8A and 8B, the horizontal axis represents the rotational position of the rotor 3 in a range of 360 degrees corresponding to one rotation of the rotor 3. The vertical axis represents the voltage of an output signal, with an upper part thereof being a positive voltage side associated with detection of the N pole, and a lower part thereof being a negative voltage side associated with detection of the S pole. The energizing polarities (+, –) of the first and second coils 4 and 5 and the magnetic poles (N, S) of the first and second magnetic pole portions 6a and 7a of the first and second yokes 6 and 7 are denoted at respective lower portions of FIGS. 8A and 8B. In FIG. 8A, the first output signal 10b from the magnetic flux detection portion 10a of the first magnetic sensor 10 is indicated by a bold solid line, and in FIG. 8B, the second output signal 11b from the magnetic flux detection portion of the third magnetic sensor 11 is indicated by a bold solid line. In FIGS. 8A and 8B, thin solid lines indicate ideal waveforms 10r and 11r of the respective first and second output signals 10b and 11b, which are not affected by the magnetic fluxes from the first and second magnetic pole portions 6a and 7a. The control circuit 13 changes the magnetic poles of the respective first and second magnetic pole portions 6a and 7a by switching the energizing polarities of the first and second coils 4 and 5 whenever associated ones of the output signal pass through 0.

As described hereinabove, when the polarities of the two first and second magnetic pole portions 6a and 7a are different from each other, the magnetic force lines 100 generated by the two 6a and 7a have almost no influence on the first and second output signals 10b and 11b from the magnetic sensors 10 and 11. However, when a + (positive) voltage is applied to both the first and second coils 4 and 5, both the first and second magnetic pole portions 6a and 7a associated therewith are each excited to the N pole, so that the first and second output signals 10b and 11b are both offset toward the positive side (N side of the vertical axis of each of FIGS. 8A and 8B). The first and second output signals 10b and 11b thus offset have waveforms 10 (+) and 11 (+) indicated by broken lines, and offset amounts thereof are approximately equal to +0.3 V. Inversely, when a – (negative) voltage is applied to both the first and second coils 4 and 5, both the first and second magnetic pole portions 6a and 7a associated therewith are each excited to the S pole, so that the first and second output signals 10b and 11b are both offset toward the negative side (S side of the vertical axis of each of FIGS. 8A and 8B). The first and second output signals 10b and 11b thus offset have waveforms 10 (–) and 11 (–) indicated by broken lines, and offset amounts thereof are approximately equal to –0.3 V.

Next, a description will be given of a problem caused by conventional driving. A case is described, by way of example, in which the rotor 3 moves in a rotational direction in which the rotational position of the rotor 3 shifts from a point of 0 degrees via a point of 180 degrees to a point of 360 degrees, i.e. the rotor 3 performs right rotation. Let it be assumed that the control circuit 13 attempts to perform driving so as to switch the energization direction of the first coil 4 whenever the rotational position of the rotor 3 becomes equal to 22.5 degrees, 67.5 degrees, and 112.5 degrees in mechanical angle, and thereafter whenever the rotor 3 further rotates through 45 degrees in mechanical angle. Further, let it be assumed that the control circuit 13 attempts to perform driving so as to switch the energization direction of the second coil 5 whenever the rotational position of the rotor 3 becomes equal to 0 degrees, 45 degrees, and 90 degrees in mechanical angle, and thereafter whenever the rotor 3 further rotates through 45 degrees in mechanical angle.

Assuming the conventional technique is used, driving is performed in which when the first output signal 10b from the first magnetic sensor 10 is positive, the energizing polarity of the first coil 4 is made positive, whereas when the first output signal 10b is negative, the energizing polarity of the first coil 4 is made negative, whereby the polarity of the magnetic poles of the first magnetic pole portions 6a is changed accordingly. Similarly, driving is performed in which when the second output signal 11b from the third magnetic sensor 11 is positive, the energization direction of the second coil 5 is made positive, whereas when the second output signal 11b is negative, the energizing polarity of the second coil 5 is made negative, whereby the polarity of the magnetic poles of the second magnetic pole portions 7a is changed accordingly.

Here, switching times of the polarity signs of the voltages of the first and second output signals 10b and 11b and those of the first and second coils 4 and 5 between positive and negative are sequentially checked, starting from the state of the rotor 3 at the rotational position of 22.5 degrees. At the moment of 22.5 degrees, the voltages of the first and second coils 4 and 5 are both negative, so that both the first and second magnetic pole portions 6a and 7a are each excited to the S pole. With this, the first and second output signals 10b and 11b vary according to a waveform 10 (−) and a waveform 11 (−) on the negative side, respectively. Next, a check is made as to the rotational position of 45 degrees and thereabouts. At the rotational position of 45 degrees, the second output signal 11b still remains negative, and hence the switching of the polarity sign of the voltage does not occur. At a rotational position of 48.75 degrees after passing the rotational position of 45 by 3.75 degrees, the second output signal 11b becomes 0, so that the voltage of the second coil 5 is switched from negative (−) to positive (+). This delay of 3.75 degrees (in mechanical angle) corresponds to a delay of 15 degrees in electrical angle.

As described above, it is understood that the energization switching time of the second coil 5 is delayed by the magnetic flux from the second magnetic pole portion 7a. Since the second output signal 11b is still on the positive side in the vicinity of the rotational position of 90 degrees, in this case as well, at a rotational position of 93.75 degrees after passing the rotational position of 90 degrees by 3.75 degrees, the second output signal 11b becomes 0, so that the voltage of the second coil 5 is switched from positive (+) to negative (−). This delay of 3.75 degrees in mechanical angle corresponds to a delay of 15 degrees in electrical angle. Similarly, in the energization of the second coil 5, a delay occurs in each of switching times in the vicinities of the rotational positions of 0 degrees (360 degrees), 45 degrees, 90 degrees, 135 degrees, 180 degrees, 225 degrees, 270 degrees, and 315 degrees. As described above, since the magnetic sensor 11 detects the magnetic fluxes from the first and second yokes 6 and 7, a time lag occurs with respect to the intended switching time of energization of the second coil 5.

On the other hand, in the first coil 4, the first output signal 10b is affected by the magnetic fluxes from the first and second magnetic pole portions 6a and 7a. However, the first coil 4 is in the state of the waveform 10r in which the switching time is not affected by the first and second magnetic pole portions 6a and 7a, in each of the rotational positions of immediately before 22.5 degrees, 67.5 degrees, 112.5 degrees, 157.5 degrees, 202.5 degrees, and the following every 45 degrees thereafter. Therefore, there occurs no delay in the switching time. Note that although the above description is given of the case where the rotor 3 performs right rotation, inversely, in a case where the rotor 3 performs left rotation, contrary to the above example, the energization switching time of the first coil 4 is delayed, but the energization switching time of the second coil 5 is not delayed.

Next, a description will be given of a driving method of the present embodiment for solving the above-described problem of the delay in the energization switching time. In the present embodiment, the control circuit 13 changes (corrects) the magnitude of a reference signal with which an output signal is compared, according to a relationship between the polarities of the magnetic poles of the first and second magnetic pole portions 6a and 7a, whereby energization of each of the first and second coils 4 and 5 is switched at intended time. In the motor control of the present embodiment, the first magnetic sensor 10, the third magnetic sensor 11, the first comparator 200, and the second comparator 201 are used (see FIG. 1). Note that it is not an absolute requirement to provide the comparators 200 and 201, the second magnetic sensor 8, and the fourth magnetic sensor 9.

FIGS. 9A and 9B are schematic diagrams of the first comparator 200 and the second comparator 201 incorporated in the control circuit 13, respectively. The first output signal 10b of the first magnetic sensor 10 and a first reference signal 300 from the reference signal changing circuit 500 are input to the first comparator 200. The first comparator 200 compares the magnitude of the first output signal 10b and that of the first reference signal 300. If the magnitude of the first output signal 10b is larger, the first comparator 200 delivers a high signal as a first comparison result signal 400. On the other hand, if the magnitude of the first output signal 10b is not larger than that of the first reference signal 300, the first comparator 200 delivers a low signal which is lower in voltage value than the high signal, as the first comparison result signal 400. The control circuit 13 determines the polarity of a voltage to be applied to the first coil 4 according to the first comparison result signal 400. More specifically, when the first comparison result signal 400 is the high signal, the control circuit 13 applies a positive voltage to the first coil 4, and sets the polarity of the first magnetic pole portions 6a to the N pole. When the first comparison result signal 400 is the low signal, the control circuit 13 applies a negative voltage to the first coil 4, and sets the polarity of the first magnetic pole portions 6a to the S pole.

The second output signal 11b from the third magnetic sensor 11, and a second reference signal 301 from the reference signal changing circuit 500 are input to the second comparator 201. The second comparator 201 compares the magnitude of the second output signal 11b and that of the second reference signal 301. If the magnitude of the second output signal 11b is larger, the second comparator 201 delivers a high signal as a second comparison result signal 401. On the other hand, if the magnitude of the second output signal 11b is not larger than that of the second reference signal 301, the second comparator 201 delivers a low signal lower in voltage value than the high signal as the second comparison result signal 401. The control circuit 13 determines the polarity of a voltage applied to the second coil 5 according to the second comparison result signal 401. When the second comparison result signal 401 is the high signal, the control circuit 13 applies a positive voltage to the second coil 5, and sets the polarity of the second magnetic pole portions 7a to the N pole. When the second comparison result signal 401 is the low signal, the control circuit 13 applies a negative voltage to the second coil 5, and sets the polarity of the second magnetic pole portions 7a to the S pole.

FIG. 10 is a table showing a relationship between the rotational position of the rotor 3, the polarities of voltages applied to the first and second coils 4 and 5, the magnetic poles of the first and second magnetic pole portions 6a and 7a, and the settings of the first and second reference signals 300 and 301 in the case where the rotor 3 is caused to perform right rotation. FIGS. 11A and 11B are diagrams showing relationships between the rotational positions of the rotor 3, the energizing polarities of the coils, and the first and second output signals 10 b and 11b, in the case where the rotor 3 is caused to perform right rotation. Particularly, FIG. 11A shows the output signal from the first magnetic sensor 10, and FIG. 11B shows the output signal from the third magnetic sensor 11. Similar to FIGS. 8A and 8B, in FIGS. 11A and 11B, the first and second output signals 10b and 11b are indicated by bold solid lines, and the first and second output signals 10b and 11b, which are offset, are represented by the waveforms 10 (+) and 11 (+) indicated by broken lines. Ideal output signals are represented by the waveforms 10r and 11r.

[Rotor rotational position from 0 degrees to 22.5 degrees]
When the rotor 3 moves from 0 degrees to 22.5 degrees in mechanical angle (0 degrees to 90 degrees in electrical angle), the voltage applied to the first coil 4 is positive, and the first magnetic pole portions 6a are each excited to the N pole. The voltage applied to the second coil 5 is negative, and the second magnetic pole portions 7a are each excited to the S pole. At this time, as described with reference to FIG. 6D, the first output signal 10b and the second output signal 11b are in a state where they have not been offset. For this reason, similar to the case of the conventional technique, the first reference signal 300 is set to 0 V. Therefore, it is possible to switch the polarity of the voltage applied to the first coil 4 from positive to negative at the rotational position of 22.5 degrees (90 degrees in electrical angle) of the rotor 3 (energization switching), as desired. On the other hand, although the second reference signal 301 is set to 0 V, time from the rotational position of 0 degrees to the rotational position of 22.5 degrees and therearound is not the inversion time of the polarity of the second coil 5 (time at which the second output signal 11b crosses the second reference signal 301). Therefore, the second reference signal 301 is not required to be set to 0 V. For example, the second reference signal 301 may be set to a voltage in expectation of the next step (−0.3 V).

[Rotor rotational position from 22.5 degrees to 45 degrees] When the rotor 3 moves from 22.5 degrees to 45 degrees in mechanical angle (90 degrees to 180 degrees in electrical angle), the voltage applied to the first coil 4 is negative, so that the first magnetic pole portions 6a are each excited to the S pole. The voltage applied to the second coil 5 is negative, so that the second magnetic pole portions 7a are each excited to the S pole. Since both the first and second magnetic pole portions 6a and 7a are each excited to the S pole, the first output signal 10b and the second output signal 11b are offset toward the negative side, as described with reference to FIG. 6C, by 0.3 V. Therefore, the second reference signal 301 is set to −0.3 V. With this, the energization switching of the voltage applied to the second coil 5 is performed at the rotor rotational position of 45 degrees, as desired.

[Rotor rotational position from 45 degrees to 67.5 degrees] When the rotor 3 moves from 45 degrees to 67.5 degrees in mechanical angle (180 degrees to 270 degrees in electrical angle), the voltage applied to the first coil 4 is negative, so that the first magnetic pole portions 6a are each excited to the S pole. The voltage applied to the second coil 5 is positive, so that the second magnetic pole portions 7a are each excited to the N pole. As described hereinabove with reference to FIG. 6D, the first output signal 10b and the second output signal 11b are not offset. For this reason, the first reference signal 300 is set to 0 V, similar to the case of the conventional technique. Therefore, it is possible to switch the polarity of the voltage applied to the first coil 4 from positive to negative at the rotational position of 67.5 degrees (270 degrees in electrical angle) of the rotor 3, as desired. On the other hand, although the second reference signal 301 is set to 0 V, time from the rotational position of 45 degrees to the rotational position of 67.5 degrees and therearound is not the inversion time of the polarity of the second coil 5 (time at which the second output signal 11b crosses the second reference signal 301). Therefore, the second reference signal 301 is not required to be set to 0 V. For example, the second reference signal 301 may be set to a voltage in expectation of the next step (+0.3V).

[Rotor Rotational Position from 67.5 Degrees to 90 Degrees]
When the rotor 3 moves from 67.5 degrees to 90 degrees in mechanical angle (270 degrees to 360 degrees in electrical angle), the voltage applied to the first coil 4 is positive, so that the first magnetic pole portions 6a are each excited to the N pole. The voltage applied to the second coil 5 is positive, so that the second magnetic pole portions 7a are each excited to the N pole. Since both the first and second magnetic pole portions 6a and 7a are each excited to the N pole, the first output signal 10b and the second output signal 11b are offset toward the positive side, as described hereinabove with reference to FIG. 6A, by 0.3 V. Therefore, the second reference signal 301 is set to +0.3 V. With this, the energization switching of the voltage applied to the second coil 5 is performed at the rotor rotational position of 90 degrees, as desired.

Note that if the rotational position of the rotor 3 is from 90 degrees to 360 degrees, by repeatedly performing the same procedure as performed from 0 degrees to 90 degrees, as described above, it is possible to perform the energization switching at desired time. This is because 0 degrees to 90 degrees, 90 degrees to 180 degrees, 180 degrees to 270 degrees, and 270 degrees to 360 degrees in mechanical angle are equivalent to each other as electrical angle.

As described heretofore, the magnetic flux detection portion 10a is located more outward in the radial direction of the magnet 2 than the center positions of the first and second magnetic pole portions 6a and 7a. Therefore, in the case of right rotation, if the polarities of the first and second magnetic pole portions 6a and 7a are both N, the control circuit 13 changes the value of the second reference signal 301 toward the positive side, whereas if the polarities of the first and second magnetic pole portions 6a and 7a are both S, the control circuit 13 changes the value of the second reference signal 301 to the negative side. The first and second output signals 10b and 11b in the case of the conventional technique where the second reference signal 301 is not changed are shown in FIGS. 8A and 8B. In contrast, in the present embodiment, the second reference signal 301 is changed as shown in FIG. 10, whereby the first and second output signals 10b and 11b are changed as show in FIGS. 11A and 11B. More specifically, the magnitude relationship between the second output signal 11b and the second reference signal 301 is inverted at each of the rotational positions of 45 degrees, 90 degrees, 135 degrees . . . , whereby it is possible to switch the voltage applied to the second coil 5 at desired time.

Note that in a case where the magnetic flux detection portion 10a is located more inward in the radial direction of the magnet 2 than the center positions of the first and second magnetic pole portions 6a and 7a, the direction of changing the second reference signal 301 becomes opposite to the case where the magnetic flux detection portion 10a is located more outward than the center positions of the same. The relationship between the position of the magnetic flux detection portion of the third magnetic sensor 11 and the direction of changing the first reference signal 300 can be considered similar to the case of the second reference signal 301.

Note that in a case where the rotor 3 is caused to perform left rotation, the relationship between the rotational position of the rotor 3, the polarities of the voltages applied to the first and second coils 4 and 5, the magnetic poles of the first and second magnetic pole portions 6a and 7a, and the settings of the first and second reference signals 300 and 301 is opposite to the case where the rotor 3 is caused to perform right rotation. More specifically, in the case of left rotation, a negative sign (−) is added to each angle value representing the rotational position of the rotor 3 in the table shown in FIG. 10. Further, the magnetic poles of the first magnetic pole portions 6a and the magnetic poles of the second magnetic pole portions 7a are inverted, and the polarity of the voltage applied to the first coil 4 and the polarity of the voltage applied to the second coil 5 are inverted. Further, each value of the first reference signal 300 and each associated value of the second reference signal 301 are inverted, i.e. replaced with each other.

As described above, the control circuit 13 controls the energization direction of the first coil 4 based on the first comparison result signal 400, and controls the energization direction of the second coil 5 based on the second comparison result signal 401. In doing this, the control circuit 13 selects one of the first reference signal 300 and the value of the second reference signal 301 according to the direction of rotation of the rotor 3, and changes the value of the selected reference signal according to a relationship between the polarity of the first magnetic pole portions 6a and the polarity of the second magnetic pole portions 7a.

Note that although the description has been given assuming that the offset amounts of the first output signal 10b and the second output signal 11b are both 0.3 V, and the offset amounts of the first and second reference signals 300 and 301 are also 0.3 V, there is a case where the offset directions and offset amounts of the first and second output signals 10b and 11b are different depending on the positional relationship between the magnetic pole portions and the magnetic sensors particularly in the radial direction. Further, there is a case where the offset amount of the first output signal 10b and that of the second output signal 11b are different from each other In these cases, the offset directions and offset amounts of the first and second reference signals 300 and 301 may be set according to the offset directions and offset amounts of the first and second output signals 10b and 11b, respectively. The offset directions and offset amounts of the first and second reference signals 300 and 301 are not required to match.

According to the present embodiment, the control circuit 13 controls the energization directions of the first and second coils 4 and 5 based on the first and second comparison result signals 400 and 401 which are output from the comparators 200 and 201 and are indicative of the respective results of comparison between the first and second output signals 10b and 11b and the first and second reference signals 300 and 301. The control circuit 13 changes the values of the first and second reference signals 300 and 301 according to the relationship between the polarity of the first magnetic pole portions 6a of the first yoke 6 and the polarity of the second magnetic pole portions 7a of the second yoke 7. This makes it possible to reduce the influence of the magnetic fluxes from the first and second yokes 6 and 7 on the switching of the energization directions. Therefore, it is possible to realize intended time of coil energization switching.

Hereinafter, a description will be given of a variation of the present embodiment, based on an example of right rotation. In the example illustrated in FIG. 10, the control circuit 13 changes the value of the second output signal 11b according to the inversion of the magnitude relationship between the second output signal 11b and the second reference signal 301, and what is more, switches the second reference signal 301 between three types of signals of −0.3 V, 0 V, and +3 V. However, the sign of the value of the second reference signal 301 may be switched whenever the magnitude relationship between the second output signal 11b and the second reference signal 301 is inverted. That is, the value of the second reference signal 301 may be switched to −0.3 V and +3 V without via 0 V. In such a case, the value of the second reference signal 301 may be set to −0.3 V or +3 V shown in parentheses, in place of 0 V, in FIG. 10. Then, in all the rotational positions, the second reference signal 301 assumes one of −0.3 V and +0.3 V. This makes it possible to reduce the number of values to be assumed from the three values of 0 V, −0.3 V, and +0.3 V to the two values of −0.3 V and +0.3 V, thereby making it possible to simplify the configuration of the reference signal changing circuit 500 (e.g. a microcomputer) for switching the values of the second reference signal 301.

Note that although as the amounts of change in the reference signal, ±0.3 V are shown by way of example, the amounts of change in the reference signal are not limited to these values. For example, in general, to change torque during driving the motor, voltages applied to the coils are sometimes changed. When the applied voltages are changed, the amounts of the magnetic fluxes generated by the first and second magnetic pole portions 6a and 7a are changed, whereby the offset amounts of the first and second output signals 10b and 11b are changed. To cope with this, the control circuit 13 may determine the amounts of change in the values of the first and second reference signals 300 and 301 according to the magnitudes of voltages applied to the first coil 4 and the second coil 5.

Note that there is a case where it is impossible to grasp the offset amounts of output signals from the magnetic sensors in advance. To solve this problem, the control circuit 13 may determine the amounts of change in the values of the first and second reference signals 300 and 301 based on the output signals delivered from the magnetic sensors when the rotor 3 is rotated by setting the first and second reference signals 300 and 301 to 0. This will be described with reference to FIG. 12.

Figure 12:
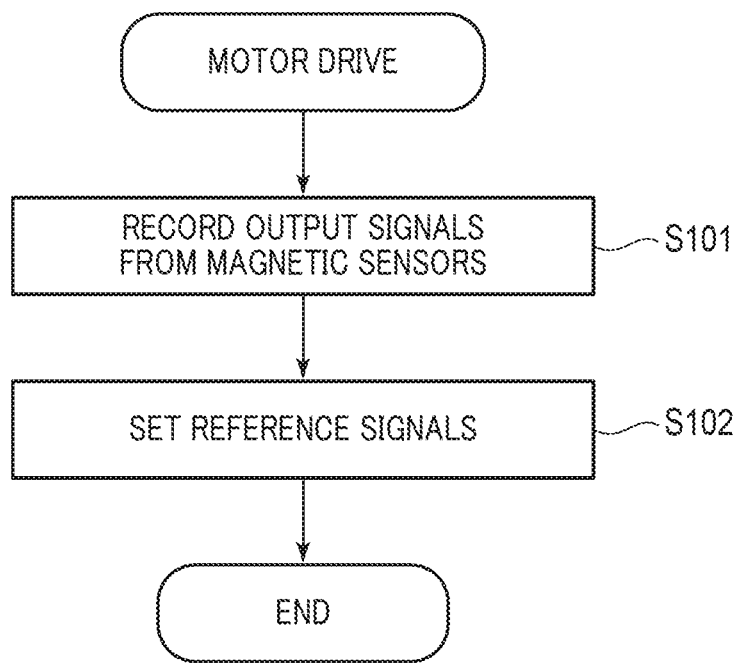
FIG. 12 is a flowchart of a reference signal setting process.

FIG. 12 is a flowchart of a reference signal setting process for setting reference signals by recording the offset amounts of the output signals. This process is realized by the CPU of the control circuit 13 which loads a program stored in the ROM of the control circuit 13 into the RAM of the same, and executes the program. The process is started upon receipt of an instruction of the reference signal setting process.

First, the control circuit 13 starts to drive the motor 1, and records changes in the first and second output signals 10b and 11b from the magnetic sensors 10 and 11 as recorded information (step S101). Then, the control circuit 13 determines amounts of change in the first and second reference signals 300 and 301 with respect to 0 based on the recorded information, and thereby sets changed values of the first and second reference signals 300 and 301 (step S102), followed by terminating the process in FIG. 12.

Figure 13:
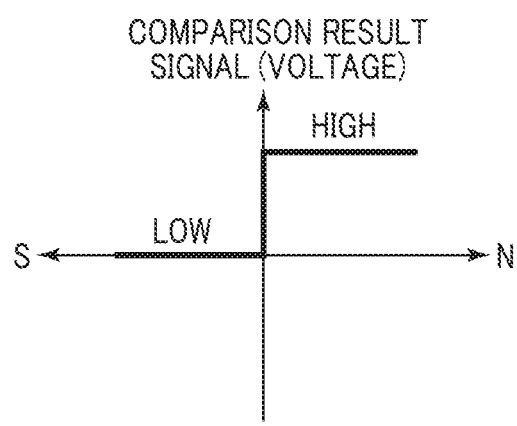
FIG. 13 is a diagram of a comparison result signal.

Next, a description will be given of a second embodiment of the present invention. The second embodiment has the same basic configuration as the first embodiment, as described with reference to FIGS. 1 to 9B. However, the first reference signal 300 used by the comparator 200 (FIG. 9A), and the second reference signal 301 used by the comparator 201 (FIG. 9B) are both set to 0. As shown in FIG. 13, the first and second comparison result signals 400 and 401 each become a high signal or a low signal. Each of the first and second comparison result signals 400 and 401 is switched between the high signal and the low signal at inversion time of the sign of an associated one of the first and second output signals 10b and 11b from positive to negative or from negative to positive. The control circuit 13 applies a first voltage to the first coil 4, and applies a second voltage to the second coil 5. The control circuit 13 applies the voltages having the same magnitude to the first and second coils 4 and 5, respectively, when energizing the first coil 4 and the second coil 5.

FIGS. 14A and 14B are diagrams showing the relationships between the rotational positions of the rotor 3, the energizing polarities of the coils, and the output signals, in the case where the rotor 3 is caused to perform right rotation (clockwise rotation, as viewed in FIGS. 4A and 4B), together the comparison result signals added thereto. Similar to FIGS. 8A and 8B, in FIGS. 14A and 14B, the relationships in a case where the magnetic sensors 10 and 11 are disposed at respective locations corresponding to electrical angles corresponding to "desired rotational positions of the rotor 3". Here, as to the first magnetic sensor 10, the desired rotational positions of the rotor 3 are 22.5 degrees, 67.5 degrees, 112.5 degrees, 157.5 degrees, 202.5 degrees, 247.5 degrees, 292.5 degrees, 337.5 degrees, in mechanical angle. Further, as to the third magnetic sensor 11, the desired rotational positions of the rotor 3 are 0 degrees (360 degrees), 45 degrees, 90 degrees, 135 degrees, 180 degrees, 225 degrees, 270 degrees, 315 degrees, . . . , in mechanical angle.

As shown in FIGS. 14A and 14B, when the polarity of the first magnetic pole portions 6a is N, the comparison result signal 400 becomes the high signal, and when the polarity of the first magnetic pole portions 6a is S, the comparison result signal 400 becomes the low signal. Similarly, when the polarity of the second magnetic pole portions 7a is N, the comparison result signal 401 becomes the high signal, and when the polarity of the second magnetic pole portions 7a is S, the comparison result signal 401 becomes the low signal. When the polarities of the first and second magnetic pole portions 6a and 7a are switched from N to S, the first and second comparison result signals 400 and 401 fall, and when the polarities of the first and second magnetic pole portions 6a and 7a are switched from S to N, the first and second comparison result signals 400 and 401 rise.

In the present embodiment, the energization direction of each of the first and second coils 4 and 5 is switched when an associated one of waiting times elapses after the sign of an associated one of the first and second output signals 10b and 11 b is inverted, that is, after the associated one of the first and second comparison result signals 400 and 401 is each switched between high and low. As described hereinafter, the waiting time is set according to the relationship between the polarities of the magnetic poles of the first and second magnetic pole portions 6a and 7a. For this reason, in the present embodiment, the magnetic sensors 10 and 11 are disposed at respective locations which are advanced (made earlier) in phase by a predetermined electrical angle with respect to the electrical angles corresponding to the "desired rotational positions of the rotor 3". Specifically, the magnetic sensors 10 and 11 are disposed at respective locations corresponding to phases advanced by 10 degrees in mechanical angle (40 degrees in electrical angle: a predetermined electrical angle) with respect to the desired rotational positions of the rotor 3.

Figure 15A:
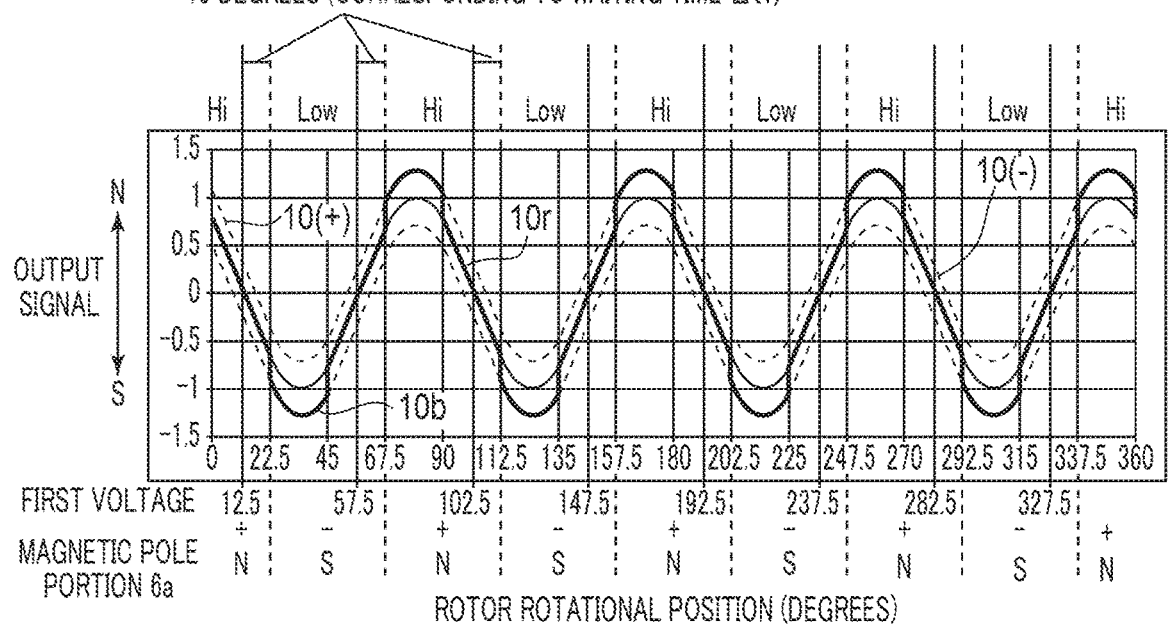
FIGS. 15A and 15B are diagrams showing the relationships between the rotational positions of the rotor, the energizing polarities of the coils, and the output signals, during the right rotation of the rotor, together with the comparison result signals added thereto, in a case where the magnetic sensors are disposed at respective locations in an advanced phase.
Figure 15B:
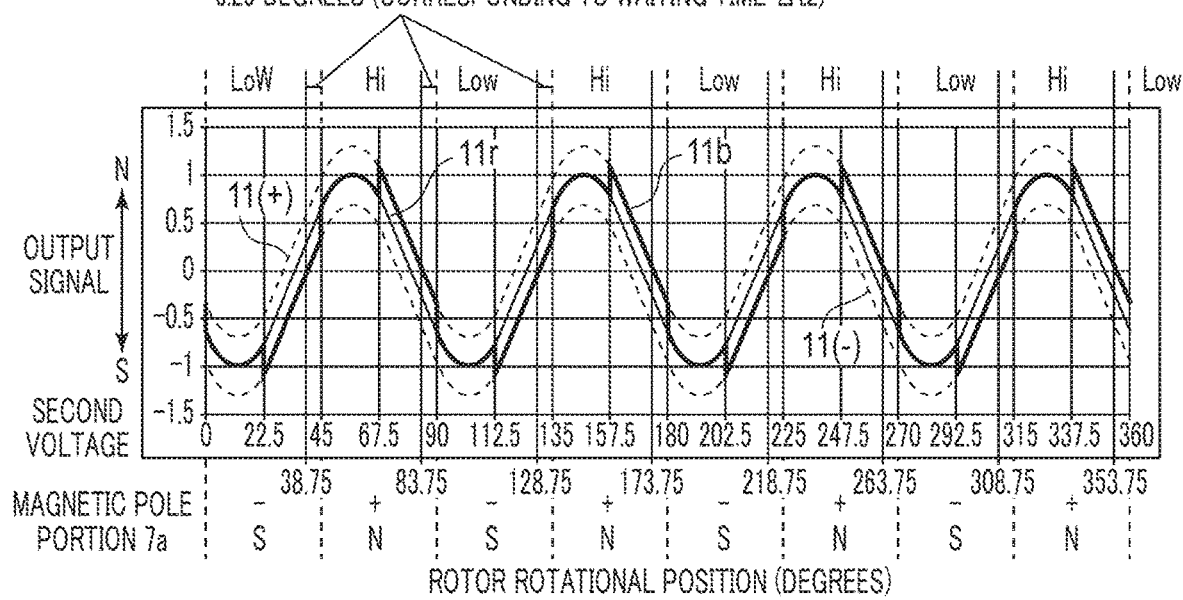

FIGS. 15A and 15B are diagrams showing the relationships between the rotational positions of the rotor 3, the energizing polarities of the coils, and the output signals, in the case where the rotor 3 is caused to perform right rotation, together with the comparison result signals added thereto, in the case where the magnetic sensors 10 and 11 are disposed at respective locations in an advanced phase. As is apparent from comparison with FIGS. 14A and 14B, since the magnetic sensors 10 and 11 are disposed at the respective locations in the advanced phase, the waveforms 10r and 11r, the first and second output signals 10b and 11b, the waveforms 10 (+) and 11 (+), and the waveforms 10 (−) and 11 (−) are all shifted by 10 degrees (leftward, as viewed in FIGS. 15A and 15B).

With such arrangements, the inversion time of each of the signs of the first and second output signals 10b and 11b becomes earlier by 10 degrees in mechanical angle. Therefore, compared with detection timing in a case where the magnetic sensors 10 and 11 are not disposed at the respective locations in the advanced phase (FIGS. 14A and 14B), the rotor rotational position associated with the time of switching each of the first and second comparison result signals 400 and 401 between high and low is made smaller by 10 degrees. More specifically, as to the first magnetic sensor 10, referring to FIG. 14A, the times of inverting the sign of the first output signal 10b correspond to 22.5 degrees, 67.5 degrees, 112.5 degrees, 157.5 degrees, 202.5 degrees, and the following every 45 degrees thereafter. However, in the present embodiment (FIG. 15A), the times of inverting the sign of the first output signal 10b are each made earlier by 10 degrees, i.e., they correspond to 12.5 degrees, 57.5 degrees, 102.5 degrees, 147.5 degrees, 192.5 degrees, and the following every 45 degrees thereafter. Further, as to the magnetic sensor 11, referring to FIG. 14B, the times of inverting the sign of the second output signal 11b are 3.75 degrees, 48.75 degrees, 93.75 degrees, 138.75 degrees, 183.75 degrees, . . . , and the following every 45 degrees thereafter. However, in the present embodiment (FIG. 15B), the times of inverting the sign of the second output signal 11b are each made earlier by 10 degrees, i.e., they correspond to −6.25 degrees (=353.75), 38.75 degrees, 83.75 degrees, 128.75 degrees, 173.75 degrees, and the following every 45 degrees thereafter.

The control circuit 13 switches the energizing polarity (energization direction) of the first voltage applied to the first coil 4 when a first waiting time Δt1 elapses after the sign of the first output signal 10b is inverted. Further, the control circuit 13 switches the energizing polarity (energization direction) of the second voltage applied to the second coil 5 when a second waiting time Δt2 elapses after the sign of the second output signal 11b is inverted. The first waiting time Δt1 and the second waiting time Δt2 are set as follows:

First, during right rotation of the rotor 3, as to the first magnetic sensor 10, there occurs no detection delay due to the influence of the polarity of the first magnetic pole portions 6*a*. For this reason, the control circuit 13 sets a time period corresponding to 10 degrees in mechanical angle as the first waiting time Δt1. The first waiting time Δt1 is calculated according to the rotational speed of the rotor 3 (number of rotations per unit time). Therefore, if the rotational speed is changed, the first waiting time Δt1 as well is changed. The control circuit 13 acquires a rotational speed N (in rps) detected by the first magnetic sensor 10. The control circuit 13 calculates the first waiting time Δt1 by the equation of Δt1 (sec)=1/N×(10 degrees/360 degrees).

On the other hand, during right rotation of the rotor 3, as to the magnetic sensor 11, there occurs a detection delay of 3.75 degrees, and hence it is required to offset the detection delay. To meet this requirement, the control circuit 13 sets a time period corresponding to 10 degrees−3.75 degrees=6.25 degrees, as the second waiting time Δt2. Accordingly, the control circuit 13 calculates the second waiting time Δt2 by the equation of Δt2 (sec)=1/N×(6.25 degrees/360 degrees). As a consequence, during right rotation of the rotor 3, the second waiting time Δt2 is shorter than the first waiting time Δt1.

By providing the waiting times, as shown in FIGS. 15A and 15B, it is possible to obtain desired energization switching times. More specifically, during right rotation of the rotor 3, by providing the first waiting time Δt1, it is possible to set the energization switching time of the first voltage applied to the first coil 4 to a desired rotational position of the rotor 3 (22.5 degrees, 67.5 degrees, . . . ). Further, during right rotation of the rotor 3, by setting the second waiting time Δt2, it is possible to set the energization switching time of the second voltage applied to the second coil 5 to a desired rotational position of the rotor 3 (0 degrees, 45 degrees, . . . ).

Further, depending on the direction of rotation of the rotor 3, coils that cause detection delay due to the influence of the polarities of the magnetic pole portions are different. For example, during left rotation of the rotor 3, as to the magnetic sensor 11, there occurs no detection delay due to the influence of the polarity of the second magnetic pole portions 7*a*. Therefore, the control circuit 13 sets a time period corresponding to 10 degrees in mechanical angle as the second waiting time Δt2. That is, the control circuit 13 calculates the second waiting time Δt2 by the equation of Δt2 (sec)=1/N×(10 degrees/360 degrees).

On the other hand, as to the first magnetic sensor 10, since there occurs a detection delay of 3.75 degrees, it is required to offset the detection delay. To meet this requirement, the control circuit 13 sets a time period corresponding to 10 degrees−3.75 degrees=6.25 degrees, as the first waiting time Δt1. Accordingly, the control circuit 13 calculates the first waiting time Δt1 by the equation of Δt1 (sec)=1/N×(6.25 degrees/360 degrees). As a consequence, during right rotation of the rotor 3, the first waiting time Δt1 becomes shorter than the second waiting time Δt2.

As described above, the control circuit 13 sets the waiting times Δt1 and Δt2 according to the direction of rotation of the rotor 3. For example, the control circuit 13 replaces the first waiting time Δt1 and the second waiting time Δt2 with each other according to the direction of rotation of the rotor 3. The direction of rotation of the rotor 3 can be known from the relationship (manner of changes) between the polarity of the first magnetic pole portions 6*a* and the polarity of the second magnetic pole portions 7*a*. This makes it possible to realize intended time of switching the energization of the coils in both of the rotational directions (driving directions).

The length relationship between one and the other of the waiting times Δt1 and Δt2 is as follows: The other of the waiting times Δt1 and Δt2 is shorter than the one of the waiting times, by a time period corresponding to the amount of delay of the inversion time of the sign of the output signal, which should occur assuming that an associated one of the magnetic sensors is disposed at a location corresponding to an electrical angle which corresponds to a desired rotational position of the rotor 3. However, it is not essential that the amount of shortness of the other of the waiting times Δt1 and Δt2 than the one of the same matches the length of a time period corresponding to the amount of delay of the inversion time of the sign of the output signal.

According to the present embodiment, the control circuit 13 switches the energization direction of each of the first and second coils 4 and 5 when the associated one of the waiting times elapses after the sign of an associated one of the first and second output signals 10*b* and 11*b* is inverted. The control circuit 13 sets the waiting times according to the relationship between the polarity of the first magnetic pole portions 6*a* and the polarity of the second magnetic pole portions 7*a*. This makes it possible to obtain the same advantageous effects as provided by the first embodiment in reducing the influence of the magnetic fluxes from the first and second yokes 6 and 7 on the switching of the energization directions.

Next, a description will be given of a variation of the second embodiment. First, although the magnetic sensors 10 and 11 are each disposed at a location corresponding to a phase advanced by 10 degrees in mechanical angle with respect to a desired rotational position of the rotor 3, the value of 10 degrees is an example, and this is not limitative. For example, let it be assumed that θ2 degrees is adopted in place of 10 degrees. In this case, during right rotation of the rotor 3, the control circuit 13 calculates the first waiting time Δt1 by the equation of Δt1 (sec)=1/N×(θ2 degrees/360 degrees). Further, the control circuit 13 calculates the second waiting time Δt2 by the equation of Δt2 (sec)=1/N×(θ2 degrees−3.75 degrees/360 degrees). During left rotation of the rotor 3, it is only required to replace the first waiting time Δt1 and the second waiting time Δt2 with each other.

Further, during right rotation of the rotor 3, 3.75 degrees is used as an angle of detection delay by the magnetic sensor 11, by way of example, but in a case where the angle of detection delay is Δα degrees, the control circuit 13 is only required to calculate the waiting times as follows: The control circuit 13 calculates the first waiting time Δt1 by the equation of Δt1 (sec)=1/N×(θ2 degrees/360 degrees). Further, the control circuit 13 calculates the second waiting time Δt2 by the equation of Δt2 (sec)=1/N×(θ2 degrees−Δα degrees/360 degrees). Here, if 92 degrees and Δα degrees are made equal, Δt2 (sec)=0 holds. During left rotation of the rotor 3, it is only required to replace the first waiting time Δt1 and the second waiting time Δt2 with each other. Therefore, it is also possible to reduce one of the waiting times to 0.

Note that it is assumed that the offset amounts of the first and second output signals 10*b* and 11*b* are both 0.3 V. However, there are cases where the offset amounts of the first and second output signals 10*b* and 11*b* are different from each other. In such cases, the control circuit 13 may set the first waiting time Δt1 and the second waiting time Δt2 in a manner associated with the offset directions and the offset amounts of the respective first and second output signals 10*b* and 11*b*. Furthermore, to change torque during driving the motor, the voltages applied to the coils are sometimes changed. When the applied voltages are changed, the offset amounts of the first and second output signals 10*b* and 11*b* are changed. To solve this problem, the control circuit 13 may set the waiting times Δt1 and Δt2 according to the magnitudes of the voltages applied to the first coil 4 and the second coil 5.

Further, there is a case where the offset amounts of the first and second output signals 10b and 11b cannot be known in advance due to differences between individual products of the motor, and changes in temperature environments. In this case, as will be described with reference to FIG. 16, the control circuit 13 may set the waiting times Δt1 and Δt2 based on motor output information recorded in association with time.

FIG. 16 is a flowchart of a waiting time setting process. This process is realized by the CPU of the control circuit 13 which loads a program stored in the ROM of the control circuit 13 into the RAM of the same, and executes the program. The process is started upon receipt of an instruction of the waiting time setting process.

First, in a step S1601, the control circuit 13 operates the motor 1 using the waiting time as a variable, by setting various waiting times, and measures motor output information (at least one of the rotational speed and the generated torque). In a step S1602, the control circuit 13 records the motor output information in association with the waiting times. In a step S1603, the control circuit 13 refers to the recorded motor output information, and sets waiting times associated with conditions for actually driving the motor 1 (the rotational speed or the generated torque) as the waiting times Δt1 and Δt2. After that, the control circuit 13 terminates the process in FIG. 16.

Note that to associate the waiting times and the motor output information with each other, the control circuit 13 may approximate correspondence therebetween by equations, and calculate the waiting times Δt1 and Δt2 using the approximate equations. Alternatively, the control circuit 13 may measure the waveforms of magnetic fluxes detected by the magnetic sensors 10 and 11 in place of the motor output, calculate a detection delay, and cause the detection delay to be reflected on the settings of the waiting times Δt1 and Δt2. A component element used for measuring the waveforms of the detected magnetic fluxes may be a Hall element or any other magnetic sensor insofar as it can detect magnetic fluxes. Further, when obtaining information of the detection delay, position information detected by a high-accuracy position detection sensor, additionally provided, and results of detection by the magnetic sensors may be compared with each other to calculate delay in detection timing of the magnetic sensors.

In the present embodiment, it is not essential to provide the comparators 200 and 201, the second magnetic sensor 8, and the fourth magnetic sensor 9.

Note that the first and second output signals 10b and 11b vary with the rotational positions of the rotor 3 and the voltages applied to the first and second coils 4 and 5. Therefore, in the first embodiment, the control circuit 13 may set the first and second reference signals 300 and 301 based on information recording the rotational positions and the applied voltages. Further, in the second embodiment, the control circuit 13 may cause the above-mentioned information recording the rotational positions and the applied voltages to be reflected on the settings of the waiting times Δt1 and Δt2. With these, it is possible to cope with the case where the offset amounts of the output signals from the magnetic sensors cannot be known in advance. Further, the characteristics of the magnet and coils vary with temperature. Therefore, in the first embodiment, the control circuit 13 may also record the temperature of the motor 1 or the temperature in the vicinity of the motor 1 as recorded information, and set the first and second reference signals 300 and 301 by taking the recorded information into account. Further, in the second embodiment, the control circuit 13 may cause the above-mentioned recorded information to be reflected on the settings of the waiting times Δt1 and Δt2. With these, even if the energization switching is affected by temperature, it is possible to realize intended time of coil energization switching, which is more preferable.

Note that although in the above-described embodiments, attention is paid to the influence of the magnetic fluxes from the first and second magnetic pole portions 6a and 7a, in addition to this, when there is an object which generates magnetism, in the vicinity of the motor 1, the output signals from the magnetic sensors are affected by the magnetism. For example, when an object, such as a motor other than the motor 1 or a solenoid, which includes a magnet or an electromagnet, is disposed in the vicinity of the motor 1, the output signals from the magnetic sensors are changed. To solve this this problem, in the first embodiment, the control circuit 13 may determine the amounts of change in the values of the first and second reference signals 300 and 301 based on information of magnetic fluxes generated from the object disposed in the vicinity of the rotor 3. In this case, the control circuit 13 may acquire information on the magnetic fluxes in advance e.g. by measurement. Further, in the second embodiment, the control circuit 13 may set the waiting times Δt1 and Δt2 based on the information on the magnetic fluxes generated from the above-mentioned object.

Note that although in the above-described embodiments, the description has been given of the construction including two magnetic sensors and two comparators, the present invention can be applied to a construction which includes a single magnetic sensor and a single comparator, for switching the energization directions of two coils based on results of comparison by the comparator between an output signal from the magnetic sensor and the reference signal.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-003467, filed Jan. 12, 2018, and No. 2018-175204, filed Sep. 19, 2018 which are hereby incorporated by reference herein in their entirety.

What is claimed is:

1. A motor control apparatus for controlling a motor that includes:
   a rotor that is rotatable and includes a magnet circumferentially divided into a plurality of portions alternately multipolar magnetized to different poles,
   a first yoke that has a first magnetic pole portion opposed to an outer peripheral surface of the rotor,
   a second yoke that has a second magnetic pole portion opposed to the outer peripheral surface of the rotor and disposed at a location shifted in electrical angle from the first magnetic pole portion,
   a first coil that is energized to excite the first magnetic pole portion,
   a second coil that is energized to excite the second magnetic pole portion, and
   a magnetic sensor that is disposed in an opposed relation to the outer peripheral surface of the rotor, for outputting a signal according to a magnetic flux, the motor control apparatus comprising:
- a comparator that outputs a comparison result signal indicative of a result of comparison between the output signal from the magnetic sensor and a reference signal, the comparator including a first comparator that compares a first output signal from the first magnetic sensor and a first reference signal and outputs a first comparison result signal, and a second comparator that compares a second output signal from the second magnetic sensor and a second reference signal and outputs a second comparison result signal; and
- a control circuit that controls energization directions of the first coil based on the first comparison result signal and the second coil based on the second comparison result signal output from the comparator,
- wherein the control circuit selects one of the first reference signal and the second reference signal according to a direction of rotation of the rotor and changes a value of the reference signal according to a relationship between a polarity of the first magnetic pole portion and a polarity of the second magnetic pole portion.

2. The motor control apparatus according to claim 1, wherein the control circuit inverts a sign of the value of the reference signal between a case where the polarity of the first magnetic pole portion and the polarity of the second magnetic pole portion are both N and a case where the polarity of the first magnetic pole portion and the polarity of the second magnetic pole portion are both S.

3. The motor control apparatus according to claim 1,
- wherein the magnetic sensor is disposed at a location more outward in a radial direction of the magnet than the first magnetic pole portion and the second magnetic pole portion, and
- wherein in the case where the polarity of the first magnetic pole portion and the polarity of the second magnetic pole portion are both N, the control circuit changes the value of the reference signal toward a positive side, and in the case where the polarity of the first magnetic pole portion and the polarity of the second magnetic pole portion are both S, the control circuit changes the value of the reference signal toward a negative side.

4. The motor control apparatus according to claim 1, wherein the control circuit changes the value of the reference signal according to inversion of a magnitude relationship between the comparison result signal and the reference signal.

5. The motor control apparatus according to claim 4, wherein the control circuit switches a sign of the value of the reference signal whenever the magnitude relationship between the comparison result signal and the reference signal is inverted.

6. The motor control apparatus according to claim 1, wherein the control circuit determines an amount of change in the value of the reference signal according to magnitudes of voltages applied to the first coil and the second coil.

7. The motor control apparatus according to claim 1, wherein the control circuit determines an amount of change in the value of the reference signal based on an output from the magnetic sensor obtained when the rotor is rotated by setting the reference signal to 0.

8. The motor control apparatus according to claim 1, wherein the control circuit determines an amount of change in the value of the reference signal based on information on a magnetic flux generated from an object disposed in the vicinity of the rotor.

9. A motor control apparatus for controlling a motor that includes:
- a rotor that is rotatable and includes a magnet circumferentially divided into a plurality of portions alternately multipolar magnetized to different poles,
- a first yoke that has a first magnetic pole portion opposed to an outer peripheral surface of the rotor,
- a second yoke that has a second magnetic pole portion opposed to the outer peripheral surface of the rotor and disposed at a location shifted in electrical angle from the first magnetic pole portion,
- a first coil that is energized to excite the first magnetic pole portion,
- a second coil that is energized to excite the second magnetic pole portion, and
- a magnetic sensor that is disposed in an opposed relation to the outer peripheral surface of the rotor, for outputting a signal according to a magnetic flux, the motor control apparatus comprising:
- a control circuit that switches an energization direction of the first coil or the second coil when a waiting time elapses after a sign of the output signal from the magnetic sensor is inverted,
- wherein the control circuit sets the waiting time according to a relationship between a polarity of the first magnetic pole portion and a polarity of the second magnetic pole portion.

10. The motor control apparatus according to claim 9, wherein the control circuit sets the waiting time according to a direction of rotation of the rotor.

11. The motor control apparatus according to claim 9,
- wherein the magnetic sensor includes a first magnetic sensor and a second magnetic sensor,
- wherein the control circuit switches the energization direction of the first coil when a first waiting time elapses after a sign of a first output signal from the first magnetic sensor is inverted, and switches the energization direction of the second coil when a second waiting time elapses after a sign of a second output signal from the second magnetic sensor is inverted, and
- wherein the control circuit replaces the first waiting time and the second waiting time with each other according to a direction of rotation of the rotor.

12. The motor control apparatus according to claim 11,
- wherein each of the first magnetic sensor and the second magnetic sensor is disposed at a location advanced in phase by a predetermined electrical angle with respect to an electrical angle corresponding to a desired rotational position of the rotor, and
- wherein one of the first waiting time and the second waiting time is a time period corresponding to the predetermined electrical angle, and the other of the first waiting time and the second waiting time is a time period shorter than the one of the first waiting time and the second waiting time.

13. The motor control apparatus according to claim 12, wherein the other of the first waiting time and the second waiting time is shorter than the one of the first waiting time and the second waiting time by a time period corresponding to an amount of delay of an inversion time of the sign of the output signal, which should occur assuming that an associated one of the magnetic sensors is disposed at the location corresponding to the electrical angle which corresponds to the desired rotational position of the rotor.

14. The motor control apparatus according to claim 9, wherein the control circuit sets the waiting time according to magnitudes of voltages applied to the first coil and the second coil.

15. The motor control apparatus according to claim 9, wherein the control circuit sets the waiting time according to a rotational speed of the rotor.

16. The motor control apparatus according to claim 9, wherein the control circuit sets the waiting time based on information on a magnetic flux generated from an object disposed in the vicinity of the rotor.

17. The motor control apparatus according to claim 9, wherein the control circuit sets the waiting time based on information in which at least one of a rotational speed of the rotor and torque is associated with time.

18. The motor control apparatus according to claim 9, wherein the magnetic sensor is disposed at a location more outward in a radial direction of the magnet than the first magnetic pole portion and the second magnetic pole portion.

19. A method of controlling a motor that includes:
- a rotor that is rotatable and includes a magnet circumferentially divided into a plurality of portions alternately multipolar magnetized to different poles,
- a first yoke that has a first magnetic pole portion opposed to an outer peripheral surface of the rotor,
- a second yoke that has a second magnetic pole portion opposed to the outer peripheral surface of the rotor and disposed at a location shifted in electrical angle from the first magnetic pole portion,
- a first coil that is energized to excite the first magnetic pole portion,
- a second coil that is energized to excite the second magnetic pole portion, and
- a magnetic sensor that is disposed in an opposed relation to the outer peripheral surface of the rotor, for outputting a signal according to a magnetic flux, the method comprising:
outputting a comparison result signal indicative of a result of comparison between the output signal from the magnetic sensor and a reference signal, the outputting of the comparison result signal including comparing a first output signal from the first magnetic sensor and a first reference signal and outputting a first comparison result signal, and comparing a second output signal from the second magnetic sensor and a second reference signal and outputting a second comparison result signal;

controlling energization directions of the first coil based on the first comparison result signal and the second coil based on the second comparison result signal;

selecting one of the first reference signal and the second reference signal according to a direction of rotation of the rotor; and changing a value of the reference signal according to a relationship between a polarity of the first magnetic pole portion and a polarity of the second magnetic pole portion.

20. A method of controlling a motor that includes:
- a rotor that is rotatable and includes a magnet circumferentially divided into a plurality of portions alternately multipolar magnetized to different poles,
- a first yoke that has a first magnetic pole portion opposed to an outer peripheral surface of the rotor,
- a second yoke that has a second magnetic pole portion opposed to the outer peripheral surface of the rotor and disposed at a location shifted in electrical angle from the first magnetic pole portion,
- a first coil that is energized to excite the first magnetic pole portion,
- a second coil that is energized to excite the second magnetic pole portion, and
- a magnetic sensor that is disposed in an opposed relation to the outer peripheral surface of the rotor, for outputting a signal according to a magnetic flux, the method comprising:
switching an energization direction of the first coil or the second coil when a waiting time elapses after a sign of the output signal from the magnetic sensor is inverted; and setting the waiting time according to a relationship between a polarity of the first magnetic pole portion and a polarity of the second magnetic pole portion.

* * * * *